(12) United States Patent
Kwon et al.

(10) Patent No.: US 11,756,900 B2
(45) Date of Patent: Sep. 12, 2023

(54) SEMICONDUCTOR DEVICES AND DATA STORAGE SYSTEMS INCLUDING THE SAME

(71) Applicant: Samsung Electronics Co., Ltd., Suwon-si (KR)

(72) Inventors: Yujin Kwon, Suwon-si (KR); Seokcheon Baek, Hwaseong-si (KR); Younghwan Son, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 99 days.

(21) Appl. No.: 17/367,082

(22) Filed: Jul. 2, 2021

(65) Prior Publication Data

US 2022/0181273 A1 Jun. 9, 2022

(30) Foreign Application Priority Data

Dec. 4, 2020 (KR) ........................ 10-2020-0168384

(51) Int. Cl.
*H01L 23/00* (2006.01)
*H01L 23/528* (2006.01)
*H01L 25/18* (2023.01)
*H10B 41/27* (2023.01)
*H10B 43/27* (2023.01)

(52) U.S. Cl.
CPC .......... *H01L 23/562* (2013.01); *H01L 23/528* (2013.01); *H01L 24/08* (2013.01); *H01L 25/18* (2013.01); *H01L 2224/08146* (2013.01); *H10B 41/27* (2023.02); *H10B 43/27* (2023.02)

(58) Field of Classification Search
CPC ..... H01L 23/562; H01L 23/528; H01L 24/06; H01L 25/18
See application file for complete search history.

(56) References Cited

U.S. PATENT DOCUMENTS

| | | | |
|---|---|---|---|
| 9,576,967 B1 | | 2/2017 | Kimura et al. |
| 10,115,681 B1* | | 10/2018 | Ariyoshi ........... H01L 21/76877 |
| 10,381,369 B2 | | 8/2019 | Kim et al. |
| 10,388,666 B1* | | 8/2019 | Kai ..................... H01L 21/8221 |
| 10,672,780 B1* | | 6/2020 | Kawamura ....... H01L 21/76802 |
| 11,410,924 B2* | | 8/2022 | Suwa ................ H01L 27/11524 |
| 11,515,227 B2* | | 11/2022 | Matsumura ........... H01L 23/562 |

(Continued)

FOREIGN PATENT DOCUMENTS

KR 1020120017970 A 2/2012

*Primary Examiner* — Nathan W Ha
(74) *Attorney, Agent, or Firm* — Muir Patent Law, PLLC

(57) ABSTRACT

A semiconductor device includes first and second gate electrodes stacked and spaced apart from each other in a first direction on a first region of a substrate, and extending in staircase form in a second direction on a second region of the substrate, the second gate electrodes disposed on the first gate electrodes; a first support structure penetrating the first gate electrodes on the second region, extending in the first direction, and having an upper end disposed at a level lower than a level of a lowermost second gate electrode among the second gate electrodes; a second support structure penetrating at least one of the first and second gate electrodes on the second region, extending in the first direction, and having an upper end disposed at a level higher than a level of un uppermost second gate electrode among the second gate electrodes.

19 Claims, 40 Drawing Sheets

(56) References Cited

U.S. PATENT DOCUMENTS

| | | | |
|---|---|---|---|
| 2012/0047321 A1 | 2/2012 | Yoon et al. | |
| 2017/0179154 A1* | 6/2017 | Furihata | H01L 27/11573 |
| 2017/0278860 A1 | 9/2017 | Aoyama | |
| 2018/0277477 A1* | 9/2018 | Ishihara | H01L 27/11582 |
| 2020/0161321 A1 | 5/2020 | Guo et al. | |
| 2020/0235120 A1* | 7/2020 | Kai | H01L 27/11582 |
| 2020/0357811 A1* | 11/2020 | Kim | H01L 23/528 |
| 2021/0134736 A1* | 5/2021 | Jhothiraman | H01L 23/5226 |
| 2021/0159149 A1* | 5/2021 | Kitazawa | H01L 27/11573 |
| 2021/0313246 A1* | 10/2021 | Matsumura | H01L 27/11519 |
| 2021/0313281 A1* | 10/2021 | Kaminaga | H01L 27/11556 |
| 2021/0327804 A1* | 10/2021 | Kim | H01L 27/11573 |
| 2021/0391345 A1* | 12/2021 | Otsu | H01L 27/11575 |
| 2022/0181270 A1* | 6/2022 | Ong | H01L 27/11556 |

* cited by examiner

SEMICONDUCTOR DEVICES AND DATA STORAGE SYSTEMS INCLUDING THE SAME

CROSS TO REFERENCE TO RELATED APPLICATION(S)

This application claims benefit of priority to Korean Patent Application No. 10-2020-0168384 filed on Dec. 4, 2020 in the Korean Intellectual Property Office, the disclosure of which is incorporated herein by reference in its entirety.

BACKGROUND

Example embodiments of the present disclosure relate to a semiconductor device and data storage systems including the same.

A semiconductor device able to store high-capacity data in a data storage system requiring data storage has been necessary. Accordingly, a method of increasing data storage capacity of a semiconductor device has been researched. For example, as one method for increasing data storage capacity of a semiconductor device, a semiconductor device including memory cells arranged three-dimensionally, instead of memory cells arranged two-dimensionally, has been suggested.

SUMMARY

An example embodiment of the present disclosure is to provide a semiconductor device having improved reliability.

An example embodiment of the present disclosure is to provide a data storage system including a semiconductor device having improved reliability.

According to an example embodiment of the present disclosure, a semiconductor device includes first gate electrodes stacked and spaced apart from each other in a first direction on a first region of a substrate, and extending in staircase form in a second direction perpendicular to the first direction on a second region of the substrate; second gate electrodes disposed on the first gate electrodes, stacked and spaced apart from each other in the first direction on the first region, and extending in staircase form in the second direction on the second region; a channel structure penetrating the first and second gate electrodes, extending in the first direction, and including a channel layer; a first support structure penetrating the first gate electrodes on the second region, extending in the first direction, and having an upper end disposed at a level lower than a level of a lowermost second gate electrode among the second gate electrodes; a second support structure penetrating at least one of the first and second gate electrodes on the second region, extending in the first direction, and having an upper end disposed at a level higher than a level of an uppermost second gate electrode among the second gate electrodes; and contact structures contacting upper surfaces of the first and second gate electrodes having staircase form, respectively.

According to an example embodiment of the present disclosure, a semiconductor device includes a substrate; first gate electrodes disposed on the substrate, stacked and spaced apart from each other in a vertical direction, and extending in staircase form in a horizontal direction; second gate electrodes disposed on the first gate electrodes, stacked and spaced apart from each other in the vertical direction, and extending in staircase form in the horizontal direction; a channel structure penetrating the first and second gate electrodes, extending in the vertical direction, and including a channel layer; first support structures penetrating at least one of gate electrodes of the first and second gate electrodes, extending in the vertical direction, and having a lower end in contact with the substrate; and contact structures connected to upper surfaces of the first and second gate electrodes having staircase form, respectively, wherein among the first support structures, each of the first support structures penetrating the first gate electrodes includes a plurality of first protrusions protruding toward lateral surfaces of the first gate electrodes.

According to an example embodiment of the present disclosure, a data storage system includes a semiconductor storage device including a peripheral circuit structure including a first substrate and circuit devices provided on the first substrate; a second substrate disposed on the peripheral circuit structure; a memory cell structure disposed on the second substrate; and an input and output pad electrically connected to the circuit devices, wherein the memory cell structure includes first gate electrodes disposed on the second substrate, stacked and spaced apart from each other in a first direction, and extending in staircase form in a second direction perpendicular to the first direction; second gate electrodes disposed on the first gate electrodes, stacked and spaced apart from each other in the first direction, and extending in staircase form in the second direction; channel structures penetrating the first and second gate electrodes, extending in the first direction, and including channel layers, respectively; a first support structure penetrating the first gate electrodes and having a first height in the first direction; a second support structure penetrating at least one of the first and second gate electrodes and having a second height greater than the first height in the first direction; and contact structures contacting upper surfaces of the first and second gate electrodes having staircase form, respectively; and a controller electrically connected to the semiconductor storage device through the input and output pad and controlling the semiconductor storage device.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, embodiments of the present disclosure will be described as follows with reference to the accompanying drawings.

Figure 1:
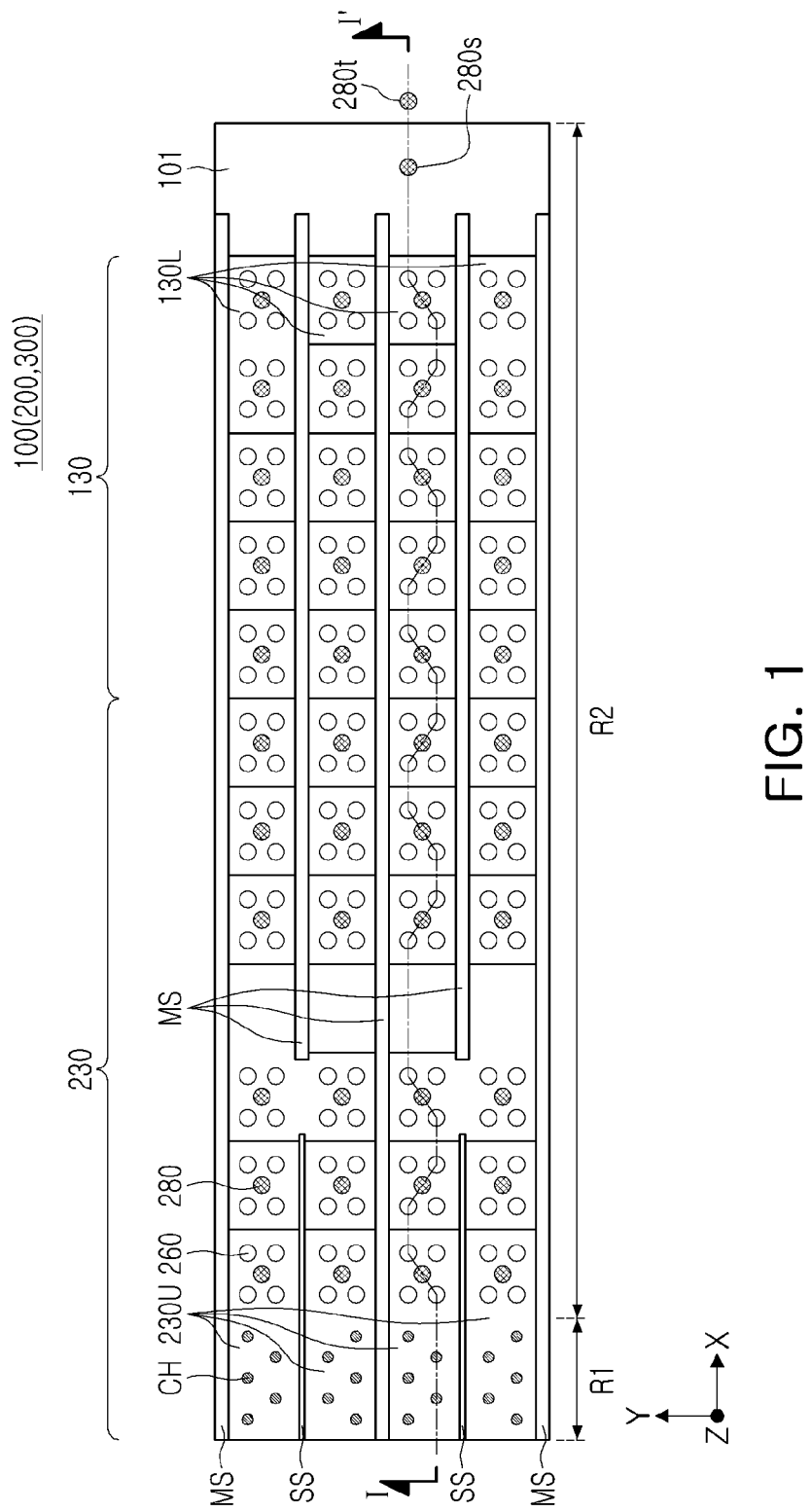
FIG. 1 is a plan view illustrating a semiconductor device according to an example embodiment of the present disclosure.

FIG. 1 is a plan view illustrating a semiconductor device according to an example embodiment.

Figure 2:
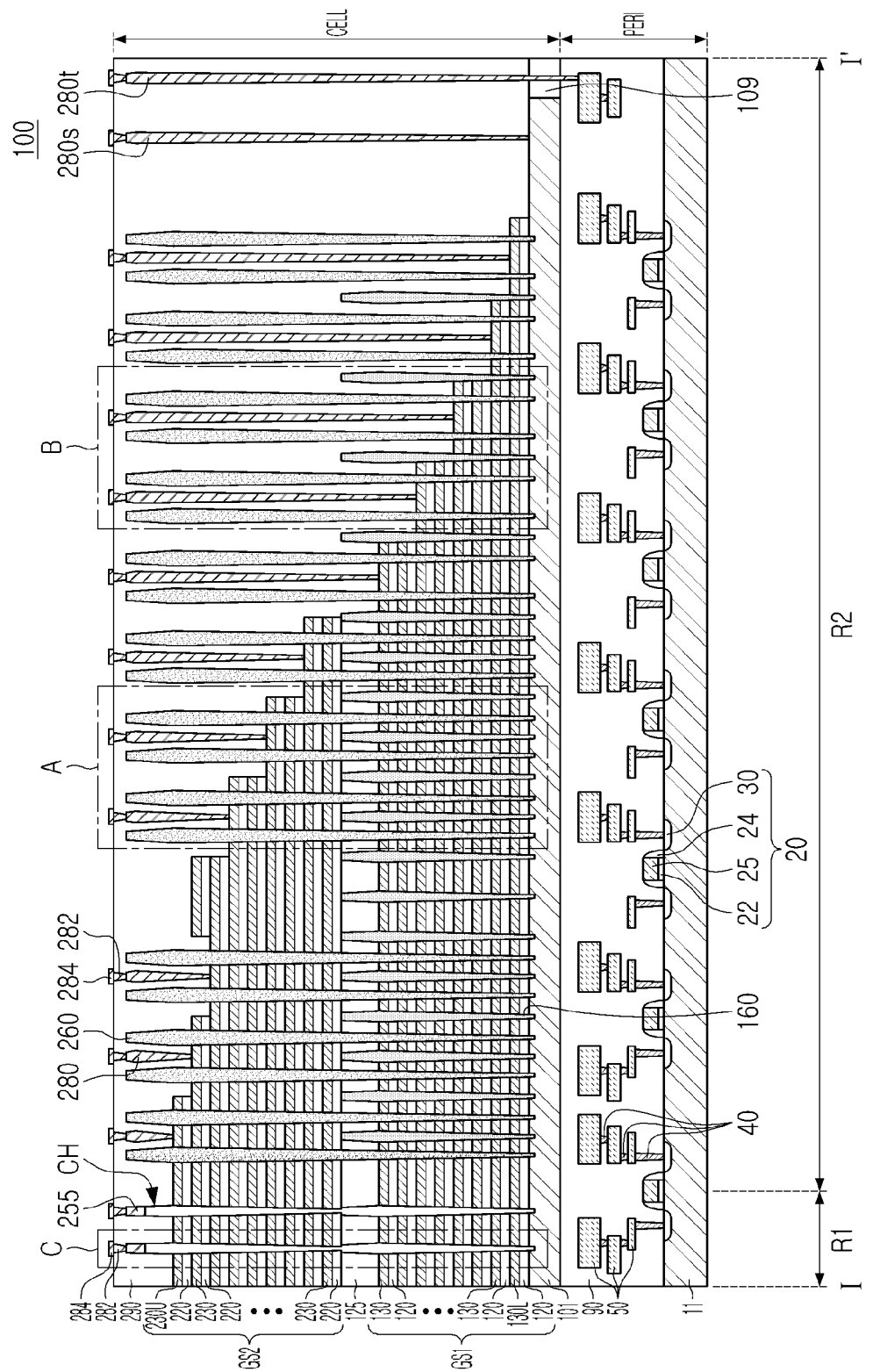
FIG. 2 is a cross-sectional view illustrating a semiconductor device according to an example embodiment of the present disclosure.

FIG. 2 is a cross-sectional view illustrating a semiconductor device taken along line I-I' in FIG. 1 according to an example embodiment.

Figure 3A:
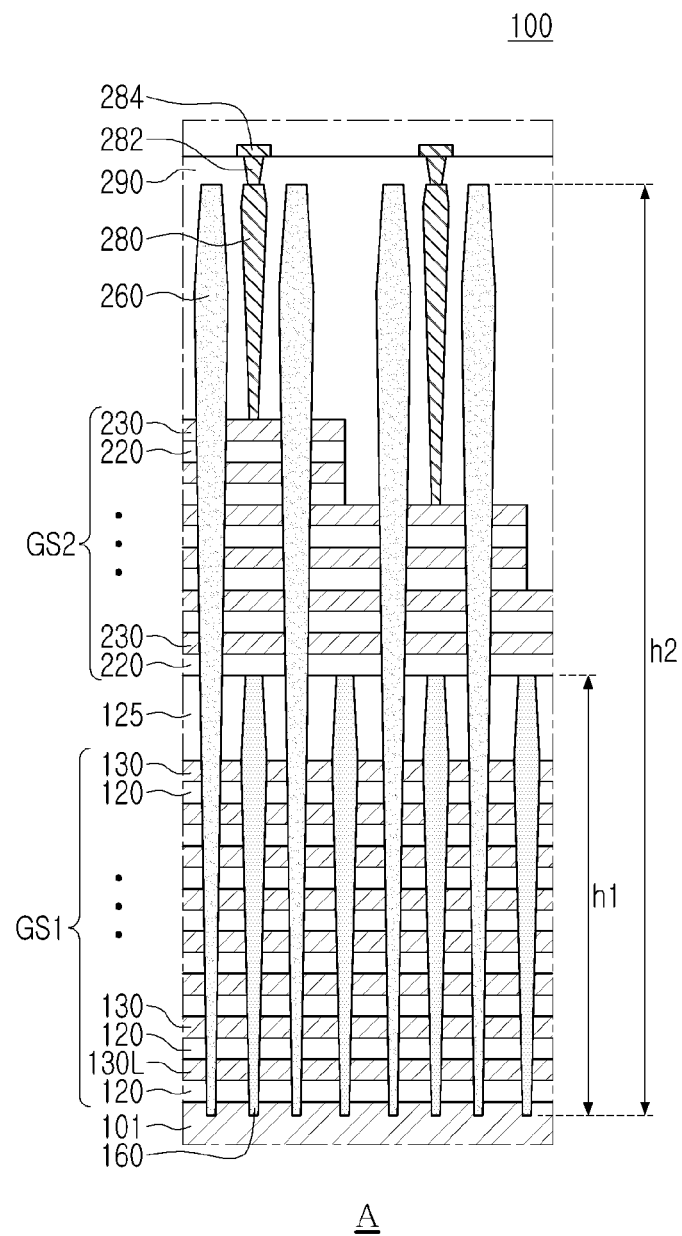
FIGS. 3A to 3C are enlarged cross-sectional views illustrating a portion of a semiconductor device according to example embodiments of the present disclosure.
Figure 3B:
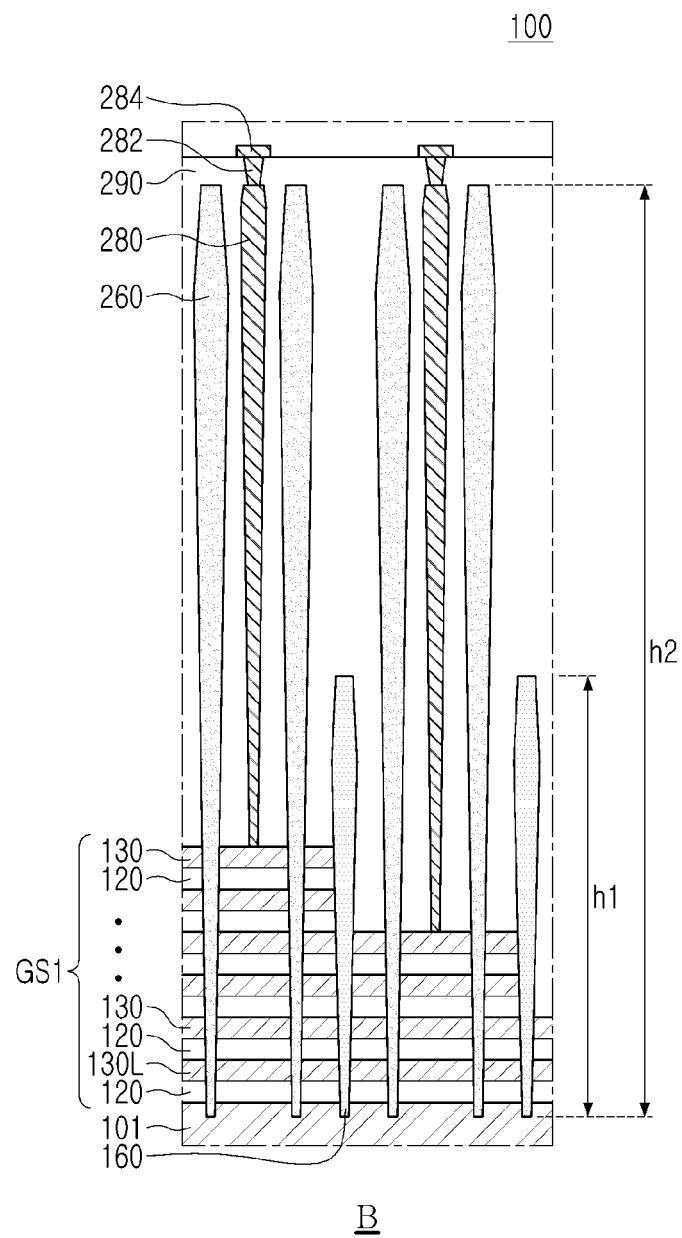
Figure 3C:
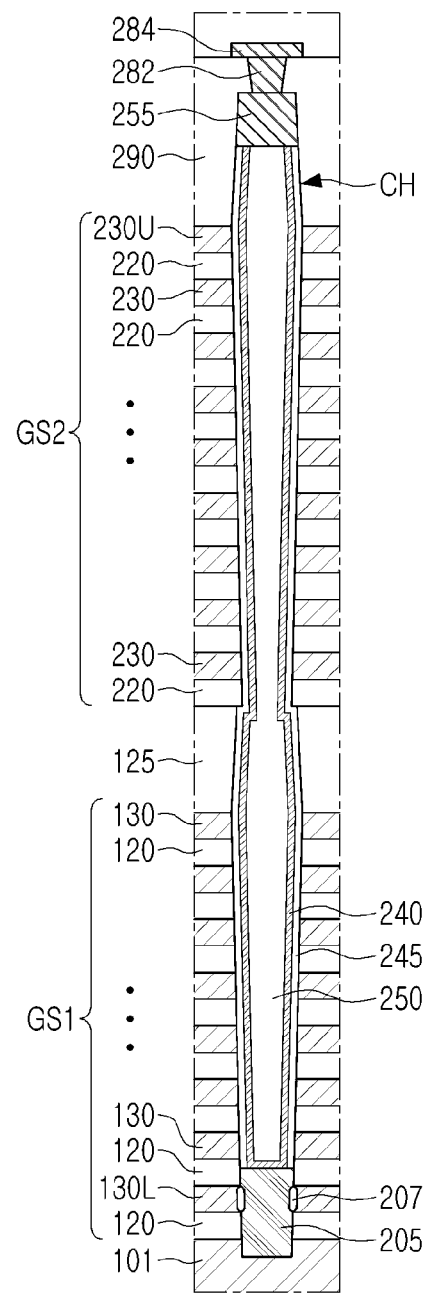

FIGS. 3A to 3C are enlarged cross-sectional views illustrating a portion of a semiconductor device according to example embodiments, illustrating regions "A," "B" and "C" in FIG. 1.

Referring to FIGS. 1, 2, and 3A to 3C, a semiconductor device 100 may include a peripheral circuit structure PERI including a first substrate 11 and a memory cell structure CELL including a second substrate 101. The memory cell structure CELL may be disposed on the peripheral circuit structure PERI. Alternatively, in an example embodiment, the memory cell structure CELL may be disposed below the peripheral circuit structure PERI.

The peripheral circuit structure PERI may include a first substrate 11, circuit devices 20 disposed on and in the first substrate 11, circuit contact plugs 40, and circuit wiring lines 50.

The first substrate 11 may include a semiconductor material, such as a group IV semiconductor, a group III-V compound semiconductor, or a group II-VI compound semiconductor. The first substrate 11 of the peripheral circuit structure PERI may be referred to as a "base substrate."

The circuit devices 20 may include a transistor. For example, among the circuit devices 20, a transistor may include a circuit gate dielectric layer 22, a circuit gate electrode 25, and source/drain regions 30. The source/drain regions 30 may be disposed in the first substrate 11 on both sides of the circuit gate electrode 25. The circuit devices 20 of the peripheral circuit structure PERI may further include a spacer layer 24 disposed on a lateral surface of the circuit gate electrode 25.

The peripheral circuit structure PERI may further include a peripheral region insulating layer 90 covering the circuit device 20 on the first substrate 11. The circuit contact plugs 40 may penetrate a portion of the peripheral insulating layer 90 and may be electrically connected to the circuit devices 20. An electrical signal may be applied to the circuit devices 20 by the circuit contact plugs 40. The circuit wiring lines 50 may be connected to the circuit contact plugs 40 and may be disposed in a plurality of layers.

The memory cell structure CELL may include a second substrate 101 having a first region R1 and a second region R2, a first stack structure GS1 including first interlayer insulating layers 120 and first gate electrodes 130 alternately stacked on the second substrate 101, a second stack structure GS2 including second interlayer insulating layers 220 and second gate electrodes 230 alternately stacked on the first stack structure GS1, channel structures CH disposed to penetrate the first and second stack structures GS1 and GS2, separation structures MS penetrating the first and second stack structures GS1 and GS2 and extending, first support structures 160 disposed to penetrate the first stack structure GS1, second support structures 260 disposed to penetrate at least one of the second stack structures GS1 and GS2, and contact structures 280 connected to the first and second gate electrodes 130 and 230. The memory cell structure CELL may further include upper separation regions SS, upper contact structures 282, upper wirings 284, and a capping insulating layer 290.

On the first region R1 of the second substrate 101, gate electrodes 130 and 230 may be vertically stacked, the channel structures CH may be disposed, and memory cells may be disposed. The gate electrodes 130 and 230 on the first region R1 may extend in staircase form on the second region R2 of the second substrate 101. The region on the second region R2 may be configured to electrically connect the memory cells to the peripheral circuit structure PERI.

In an example embodiment, the region on the first region R1 may be referred to as "memory cell region" or "memory cell array region" in which memory cells are disposed, and the region on the second region R2 may be referred to as "staircase region" in which the gate electrodes 130 and 230 are disposed in staircase form, or an "extension region" or a "connection region" in which the gate electrodes 130 and 230 extend by different lengths.

The second substrate 101 may have an upper surface extending in a X direction (or, a first direction) and a Y direction (or, a second direction) perpendicular to the X direction. The second substrate 101 may include a silicon layer. The second substrate 101 may further include impurities. For example, the second substrate 101 may include a silicon layer having n-type conductivity. The second substrate 101 may include a polycrystalline silicon layer having n-type conductivity. In example embodiments, the second substrate 101 may have a thickness less than that of the first substrate 11, but an example embodiment thereof is not limited thereto.

The first gate electrodes 130 may be stacked on the second substrate 101 and may be vertically spaced apart from each other, and may form the first stack structure GS1. The second gate electrodes 230 may be vertically stacked on the first stack structure GS1 and may be spaced apart from each other, and may form the second stack structure GS2. The gate electrodes 130 and 230 may include a lower gate electrode 130L forming a gate of a ground select transistor, memory gate electrodes 130 and 230 for forming a plurality of memory cells, and upper gate electrodes 230U forming gates of string select transistors. The number of memory gate electrodes 130 and 230 forming the memory cells may be determined depending on data storage capacity of the semiconductor device 100. In example embodiments, the number of each of the lower and upper gate electrodes 130L and 230U may be one to four or more, respectively, and the lower and upper gate electrodes 130L and 230U may have the same structure as or different structures from those of the memory gate electrodes 130 and 230.

The gate electrodes 130 and 230 may be stacked vertically on the first region R1, may be spaced apart from each other, may extend by different lengths from the first region R1 to the second region R2, and may form a step structure in staircase form. As illustrated in FIGS. 1 and 2, the gate electrodes 130 and 230 may form a step structure between the gate electrodes 130 and 230 in the X direction. In example embodiments, at least a portion of the gate electrodes 130 and 230, two to six gate electrodes 130 and 230, for example, may form a single gate group and may form a step structure between the gate groups in the X direction. In this case, the gate electrodes 130 and 230 forming a single gate group may be disposed to have a step structure in the Y direction as well. By the step structure, the gate electrodes 130 and 230 may form staircase form in which the lower gate electrodes 130 and 230 extend further than the upper gate electrodes 130 and 230 such that ends exposed upwardly from the interlayer insulating layers 120 and 220 may be provided. In example embodiments, the gate electrodes 130 and 230 may have an increased thickness on the ends.

As illustrated in FIG. 1, the gate electrodes 130 and 230 may be isolated from each other in the Y direction by separation structures MS extending in the X direction. The gate electrodes 130 and 230 between a pair of separation structures MS may form a single memory block, but an example embodiment of the memory block is not limited thereto.

The gate electrodes 130 and 230 may include a metallic material, tungsten (W), for example. According to an example embodiment, the gate electrodes 130 and 230 may include polycrystalline silicon or a metal silicide material. In example embodiments, the gate electrodes 130 and 230 may further include a diffusion barrier. For example, the diffusion barrier may include tungsten nitride (WN), tantalum nitride (TaN), titanium nitride (TiN), or a combination thereof. In an example embodiment, the gate electrodes 130 and 230 may further include a metal oxide layer such as aluminum oxide.

In the example embodiment, it has been described that the gate stack structures of the gate electrodes 130 and 230 may be arranged in two stages, but the gate stack structures of the gate electrodes 130 and 230 may include a structure of a different number of stages (e.g., three or four stages). In other words, the number of stack structures stacked in a Z direction (or, a third direction) perpendicular to the X direction and Y direction and the number of channel structures may be varied.

The first interlayer insulating layers 120 may be alternately stacked with the first gate electrodes 130 on the second substrate 101, and may form the first stack structure GS1 together with the first gate electrodes 130. The second interlayer insulating layers 220 may be alternately stacked with the second gate electrodes 230 on the first stack structure GS1, and may form the second stack structure GS2 together with the second gate electrodes 230. Similarly to the gate electrodes 130 and 230, the interlayer insulating layers 120 and 220 may be spaced apart from each other in a direction perpendicular to an upper surface of the second substrate 101 and may extend in the X direction. The interlayer insulating layers 120 and 220 may include an insulating material such as silicon oxide or silicon nitride. A connection insulating layer 125 may be further disposed between the first and second stack structures GS1 and GS2 in addition to the interlayer insulating layers 120 and 220.

The channel structures CH may be spaced apart from each other and may form rows and columns on an upper surface of the second substrate 101 on the first region of the second substrate 101. The channel structures CH may be disposed to form a grid pattern or may be disposed in a zigzag pattern in one direction. The channel structures CH may have a columnar shape, and may have inclined lateral surfaces having a width decreasing toward the second substrate 101 depending on an aspect ratio.

Each of the channel structures CH may have a form in which lower and upper channel structures penetrating the first and second stack structures GS1 and GS2 of the gate electrodes 130 and 230, respectively, are connected to each other, and may have a bent portion formed by a difference or a change in width in the connection region. In example embodiments, a portion of the channel structures CH may be dummy channels.

As illustrated in FIG. 3C, the channel structure CH may include a channel layer 240, a channel insulating layer 250, a channel pad 255, a gate dielectric layer 245, and an epitaxial layer 205. The channel layer 240, the gate dielectric layer 245, and the channel insulating layer 250 may be connected to each other between the lower channel structure and the upper channel structure.

The channel layer 240 may be formed in an annular shape surrounding the channel insulating layer 250 therein, but in example embodiments, the channel layer 240 may have a columnar shape such as a cylindrical shape or a prism shape without the channel insulating layer 250. The channel layer 240 may be connected to the epitaxial layer 205 in a lower portion of the channel layer 240. The channel layer 240 may include a semiconductor material such as polycrystalline silicon or single crystal silicon, and the semiconductor material may be an undoped material or a material including p-type or n-type impurities.

A channel pad 255 may be disposed above the channel layer 240 in the channel structure CH. The channel pad 255 may be disposed to cover un upper surface of the channel insulating layer 250 and to be electrically connected to the channel layer 240. The channel pad 255 may include, for example, doped polycrystalline silicon.

The gate dielectric layer 245 may be disposed between the gate electrodes 230 and the channel layer 240. Although not illustrated in detail, the gate dielectric layer 245 may include a tunneling layer, a data storage layer, and a blocking layer stacked in order from the channel layer 240. The tunneling layer may tunnel charges to the data storage layer, and may include, for example, silicon oxide, silicon nitride, silicon oxynitride, or a combination thereof. The data storage layer may be a charge trap layer or a floating gate conductive layer. The blocking layer may include silicon oxide, silicon nitride, silicon oxynitride, a high-k dielectric material, or a combination thereof.

The epitaxial layer 205 may be disposed on the upper surface of the second substrate 101 on the lower end of the channel structure CH, and may be disposed on a lateral surface of at least one first gate electrode 130. The epitaxial layer 205 may be connected to the channel layer 240. The epitaxial layer 205 may be disposed in the recess region of the second substrate 101. An insulating layer 207 may be disposed between the epitaxial layer 205 and the lower gate electrode 130L. In example embodiments, the epitaxial layer 205 may not be provided. In this case, the channel layer 240 may be directly connected to the second substrate 101 or may be connected to a conductive layer on the second substrate 101.

The separation structure MS may penetrate the gate electrodes 130 and 230 and may extend in the X direction. A plurality of the separation structures MS may be disposed parallel to each other on a plane. The separation structure MS may penetrate the entire gate electrodes 130 and 230 stacked on the lower surface of the second substrate 101 and may be connected to the second substrate 101. The separation structure MS may extend without bent portions in the lower and upper stack structures of the gate electrodes 130 and 230, but an example embodiment thereof is not limited thereto. For example, the separation structure MS may also have a form in which lower and upper separation regions may be connected to each other, similarly to the channel structures CH.

The separation structure MS may have a shape in which a width thereof may decrease towards the second substrate 101 due to a high aspect ratio. The separation structure MS may include, for example, silicon oxide, silicon nitride, or silicon oxynitride as an insulating material. In example embodiments, a conductive layer may be further disposed on the separation structure MS. In this case, the conductive layer may function as a common source line of the semiconductor device 100 or a contact plug connected to the common source line.

As illustrated in FIG. 1, the upper separation region SS may extend in the X direction between the separation structures MS in the first region R1. The upper separation regions SS may be disposed to penetrate a portion of the gate electrodes 230 including the uppermost second gate electrode 230U among the second gate electrodes 230. As illustrated in FIG. 1, the upper separation regions SS may isolate two gate electrodes 230 including the uppermost second gate electrodes 230U from each other in the Y direction, for example. The number of gate electrodes 230 isolated by the upper separation regions SS may be varied in example embodiments. The upper gate electrodes 230U isolated by the upper separation regions SS may form different string selection lines. The upper separation regions SS may include an insulating material. The insulating material may include, for example, silicon oxide, silicon nitride, or silicon oxynitride.

The first support structure 160 may penetrate the first stack structure GS1 including the first gate electrodes 130 on the second region R2 and may extend in the Z direction. An upper end of the first support structure 160 may be disposed at a level lower than a level of the lowermost second gate electrode 230 among the second gate electrodes 230, and may be disposed at a level higher than a level of the uppermost first gate electrode 130 among the first gate electrodes 130. In example embodiments, a height of the level may be defined with reference to the upper surface of the second substrate 101. A lower end of the first support structure 160 may be in contact with the silicon layer of the second substrate 101. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact. The first support structure 160 may include a lateral surface inclined with respect to the upper surface of the second substrate 101. For example, the first support structure 160 may include an inclined lateral surface of which a width decreases toward the second substrate 101. The first support structure 160 may include an insulating material, such as silicon oxide, silicon nitride, silicon oxynitride, or a combination thereof, for example.

The first support structures 160 may be arranged in a regular pattern on a plane. For example, a portion of the first support structures 160 may be disposed in a position overlapping a portion of the contact structures 280 in the Z direction. However, among the contact structures 280, the other contact structures 280 connected to the first gate electrodes 130 may not overlap the first support structures 160. In an example embodiment, the first support structures 160 may have a circular, elliptical, elongated, or elliptical shape on a plane.

The first support structures 160 may be spaced apart from the second support structures 260 between the second support structures 260. The first support structure 160 may have a first height h1 smaller than a second height h2 of the second support structure 260. For example, the first height h1 may refer to a vertical length between the lower end of the first support structure 160 and the upper end of the first support structure 160, and the second height h2 may refer to a vertical length between the lower end of the second support structure 260 and the upper end of the second support structure 260.

The first support structure 160 may stably support the lower stack structure of the first interlayer insulating layer 120 during a process of removing gate sacrificial layers. When the first support structures 160 are not provided, a horizontal distance between the second support structures 260 adjacent each other may increase toward downwardly, such that stability of the lower stack structure of the first interlayer insulating layers 120 may be deteriorated. Stability of the lower stack structure may be secured by arranging the second support structures 260 to be adjacent to each other, but due to the inclined lateral surfaces of the second support structures 260, the second support structures 260 may be in contact with each other or may be connected to each other, or the second support structures 260 and the contact structure 280 may be in contact with each other or may be connected to each other. According to an example embodiment, by disposing the first support structures 160 to penetrate the lower stack structure of the first interlayer insulating layers 120 having relatively weak support strength between the second support structures 260, the upper regions of the second support structures 260 and the contact structures 280 may not be in contact with each other, and structural stability of the lower stack structure may be secured.

At least one of the second support structures 260 may be disposed to penetrate a first stack structure GS1 including the first gate electrodes 130 and a second stack structure GS2 including the second gate electrodes 230 on the second region R2, and may extend in the Z direction. The other second support structures 260 may be disposed to penetrate only the first stack structure GS1 including the first gate electrodes 130 on an external side of the second gate electrodes 230 having a step structure. Differently from the channel structure CH, the second support structure 260 may extend without a bent portion in a region in which the upper region is connected to the lower region. For example, a portion of the second support structure 260 penetrating the stack structures GS1 and GS2 may include a lateral surface of which a width continuously decreases toward the lower portion. The upper end of the second support structure 260 may be disposed at a level higher than a level of the uppermost second gate electrode 230U of the second gate electrodes 230. The lower end of the second support structure 260 may be in contact with the silicon layer of the second substrate 101. The second support structure 260 may include an inclined lateral surface, inclined with respect to the upper surface of the second substrate 101. For example, the second support structure 260 may include an inclined lateral surface of which a width may decrease toward the second substrate 101. The second support structures 260 may be arranged in a predetermined pattern on a plane. The second support structure 260 may include an insulating material, silicon oxide, silicon nitride, silicon oxynitride, or a combination thereof, for example. The second support structure 260 may have a second height h2 greater than the first height h1 of the first support structure 160. The second support structure 260 may support the stack structure together with the first support structure 160.

The contact structures 280 may penetrate a portion of the capping insulating layer 290 from an upper portion on the second region R2 and may be connected to the upper surfaces of the gate electrodes 130 and 230 having staircase form, respectively. The contact structures 280 may be partially recessed into the gate electrodes 130 and 230 and may be connected to the gate electrodes 130 and 230. The contact structures 280 may be electrically connected to upper wirings 284 in an upper portion. The contact structures 280 may electrically connect the gate electrodes 130 and 230 to the circuit devices 20 of the peripheral circuit structure PERI. The arrangement position, the number, and the shape of the contact structures 280 may be varied. The contact structures 280 may include a conductive material, and may include, for example, tungsten (W), copper (Cu), aluminum (Al), or the like. The contact structures 280 may further include a barrier metal layer formed of metal nitride. The contact structures 280 may include a substrate contact structure 280s connected to the silicon layer of the second substrate 101 and a through contact structure 280t penetrating the substrate insulating layer 109 and connected to the circuit wiring lines 50.

The upper contact structures 282 may penetrate the capping insulating layer 290 and may be connected to the channel structures CH and the contact structures 280. The upper contact structures 282 may include a conductive material, and may include, for example, tungsten (W), copper (Cu), aluminum (Al), or the like.

The upper wirings 284 may form an upper wiring structure electrically connected to the memory cells in the memory cell structure CELL. The upper wirings 284 may include a conductive material, and may include, for example, tungsten (W), copper (Cu), aluminum (Al), or the like.

The capping insulating layer 290 may be disposed to cover the second substrate 101, the gate electrodes 130 and 230 on the second substrate 101, and the substrate insulating layer 109. The capping insulating layer 290 may be formed of an insulating material, and may be formed of a plurality of insulating layers.

Figure 4A:
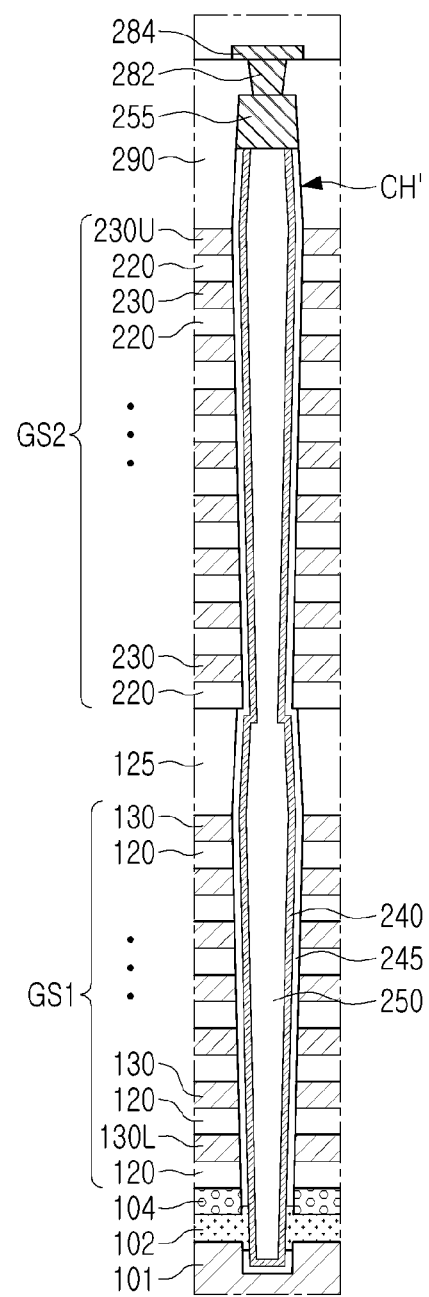
FIGS. 4A and 4B are enlarged cross-sectional views illustrating a portion of a semiconductor device according to example embodiments of the present disclosure.
Figure 4B:
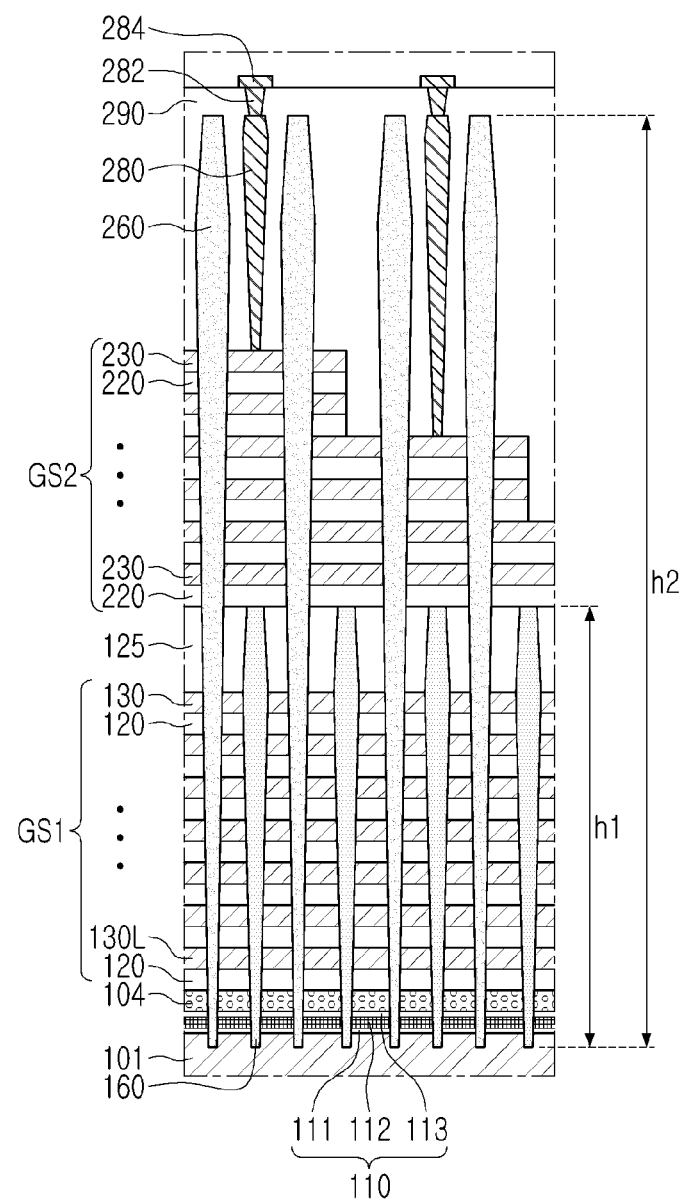

FIGS. 4A and 4B are enlarged cross-sectional views illustrating a portion of a semiconductor device according to example embodiments, illustrating regions "C" and "A" in FIG. 1.

Referring to FIGS. 4A and 4B, first and second horizontal conductive layers 102 and 104 may be stacked in order on the upper surface of the first region R1 of the second substrate 101. The first horizontal conductive layer 102 may not extend to the second region R2 of the second substrate 101, and the second horizontal conductive layer 104 may extend to the second region R2.

The first horizontal conductive layer 102 may function as a portion of a common source line of the semiconductor device 100, and may, for example, function as a common source line together with the second substrate 101. As illustrated in FIG. 4A, the first horizontal conductive layer 102 may be directly connected to the channel layer 240 in a portion of the channel layer 240 of the channel structure CH'.

The second horizontal conductive layer 104 may be in contact with the second substrate 101 in partial regions in which the first horizontal conductive layer 102 and a horizontal insulating layer 110 are not disposed. The second horizontal conductive layer 104 may be bent to cover ends of the first horizontal conductive layer 102 or the horizontal insulating layer 110 in the above-mentioned regions and may extend onto the second substrate 101.

The first and second horizontal conductive layers 102 and 104 may include a semiconductor material, and both the first and second horizontal conductive layers 102 and 104 may include polycrystalline silicon, for example. In this case, at least the first horizontal conductive layer 102 may be a doped layer, and the second horizontal conductive layer 104 may be a doped layer or a layer including impurities diffused from the first horizontal conductive layer 102. In example embodiments, the second horizontal conductive layer 104 may be replaced with an insulating layer.

The horizontal insulating layer 110 may be disposed on the second substrate 101 and may be disposed side by side with the first horizontal conductive layer 102 on at least a portion of the second region R2. As illustrated in FIG. 4B, the horizontal insulating layer 110 may include first to third horizontal insulating layers 111, 112, and 113 stacked in order on the second region R2 of the second substrate 101. The horizontal insulating layer 110 may be layers remaining after a portion of the horizontal insulating layer 110 during the manufacturing process replacing with the first horizontal conductive layer 102.

The horizontal insulating layer 110 may include silicon oxide, silicon nitride, silicon carbide, or silicon oxynitride. The first and third horizontal insulating layers 111 and 113 and the second horizontal insulating layer 112 may include different insulating materials. The first and third horizontal insulating layers 111 and 113 may include the same material. For example, the first and third horizontal insulating layers 111 and 113 may be formed of the same material as a material of the interlayer insulating layers 120 and 220, and the second horizontal insulating layer 112 may be formed of the same material as a material of sacrificial insulating layers 128 and 228 in FIG. 5.

The first support structures 160 and the second support structures 260 may be disposed to penetrate the second horizontal conductive layer 104 and the horizontal insulating layer 110 in the second region R2. The example embodiment in FIGS. 4A and 4B may also be applied to other example embodiments.

Figure 5:
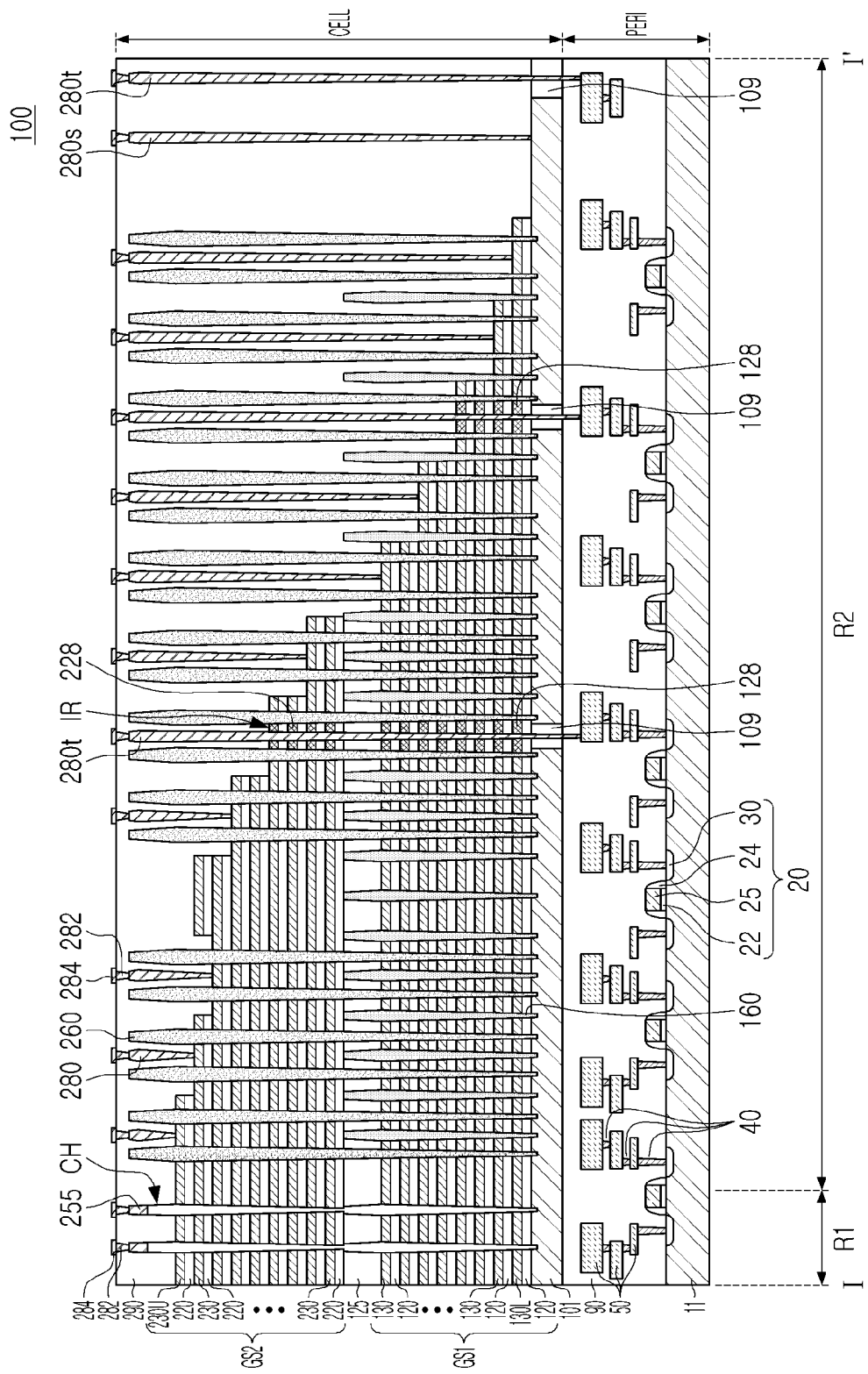
FIG. 5 is a cross-sectional view illustrating a semiconductor device according to an example embodiment of the present disclosure.

FIG. 5 is a cross-sectional view illustrating a semiconductor device according to an example embodiment, illustrating a region corresponding to FIG. 2.

Referring to FIG. 5, the semiconductor device 100 may further include a through insulating region IR and a through contact structure 280t penetrating the through insulating region IR.

The through insulating region IR may include a substrate insulating layer 109, that is a first insulating layer disposed at the same level as a level of the second substrate 101 side by side with the second substrate 101, interlayer insulating layers 120 and 220, that are second and third insulating layers and the sacrificial insulating layers 128 and 228, respectively and alternately stacked on the upper surface of the second substrate 101. The substrate insulating layer 109, the interlayer insulating layers 120 and 220, and the sacrificial insulating layers 128 and 228 may be formed of an insulating material, and may include, for example, silicon oxide, silicon nitride, or silicon oxynitride.

The through contact structure 280t may vertically penetrate the entire through insulating region IR, may extend perpendicularly to the upper surface of the second substrate 101, and may electrically connect the memory cell structure CELL to the circuit devices 20 of the peripheral circuit structure PERI. For example, the through contact structure 280t may connect the gate electrodes 130 and 230 and/or the channel structures CH of the memory cell structure CELL to the circuit devices 20 of the peripheral circuit structure PERI. The through contact structure 280t may penetrate the gate electrodes 130 and 230 and the second substrate 101. The through contact structure 280t may be connected to upper wirings 284 in an upper portion. The through contact structure 280t may be connected to circuit wiring lines 50 in a lower portion.

Figure 6:
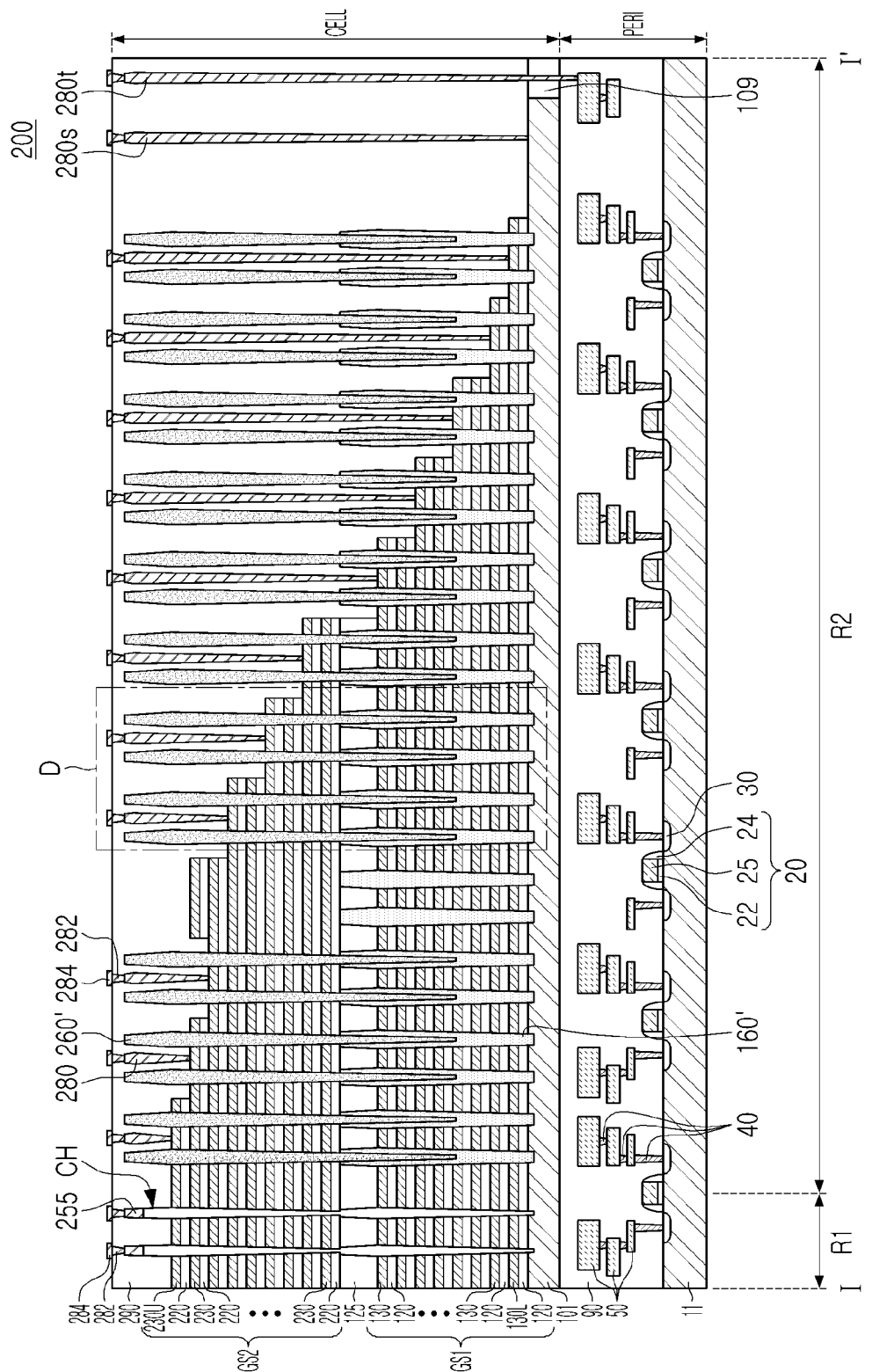
FIG. 6 is a cross-sectional view illustrating a semiconductor device according to an example embodiment of the present disclosure.

FIG. 6 is a cross-sectional view illustrating a semiconductor device according to an example embodiment, illustrating a region corresponding to FIG. 2.

Figure 7:
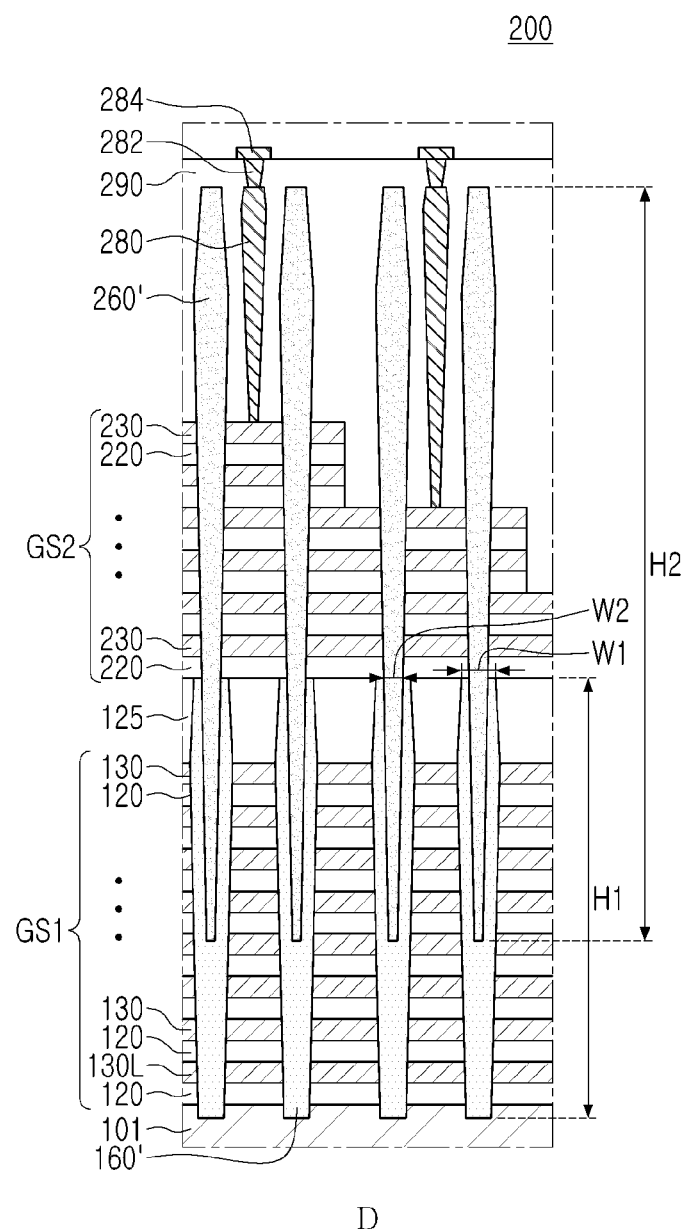
FIG. 7 is an enlarged cross-sectional view illustrating a portion of a semiconductor device according to an example embodiment of the present disclosure.

FIG. 7 is an enlarged cross-sectional view illustrating a portion of a semiconductor device according to an example embodiment, illustrating a region "D" in FIG. 6.

Referring to FIGS. 6 and 7, a semiconductor device 200 may include a peripheral circuit structure PERI and a memory cell structure CELL similarly to the aforementioned example embodiment described with reference to FIGS. 1, 2, and 3A to 3C, and the structures of the first support structure 160' and the second support structure 260' may be partially modified.

At least a portion of the first support structure 160' may overlap at least a portion of the second support structure 260' in the Z direction. The second support structure 260' may include a portion in contact with the first support structure 160'. The lower end of the second support structure 260' may be disposed within the first support structure 160'. For example, the lower end of the second support structure 260' may be disposed at a level higher than a level of the lower end of the first support structure 160', and may be disposed at a level lower than a level of the upper end of the first support structure 160'. The first support structure 160' may have a first height H1, a vertical length between an upper end and a lower end, and the second support structure 260' may have a second height H2, a vertical length between an upper end and a lower end. The first height H1 may be smaller than the second height H2.

The first support structure 160' may have a relatively large width as compared to the aforementioned example embodiment in order to stably support the stack structure of the first interlayer insulating layers 120. For example, a maximum width of the first support structure 160' may be greater than a maximum width of the channel structure CH. An upper end of the first support structure 160' may have a first width W1, and the second support structure 260' may have a second width W2 smaller than the first width W1 in a region penetrating the upper end of the first support structure 160'. By disposing the first support structure 160' to have a relatively large width in a region in which structural stability of the stack structure is weakened due to a decreasing width of the second support structure 260' towards a lower portion, structural stability of the stack structure may be secured.

Figure 8A:
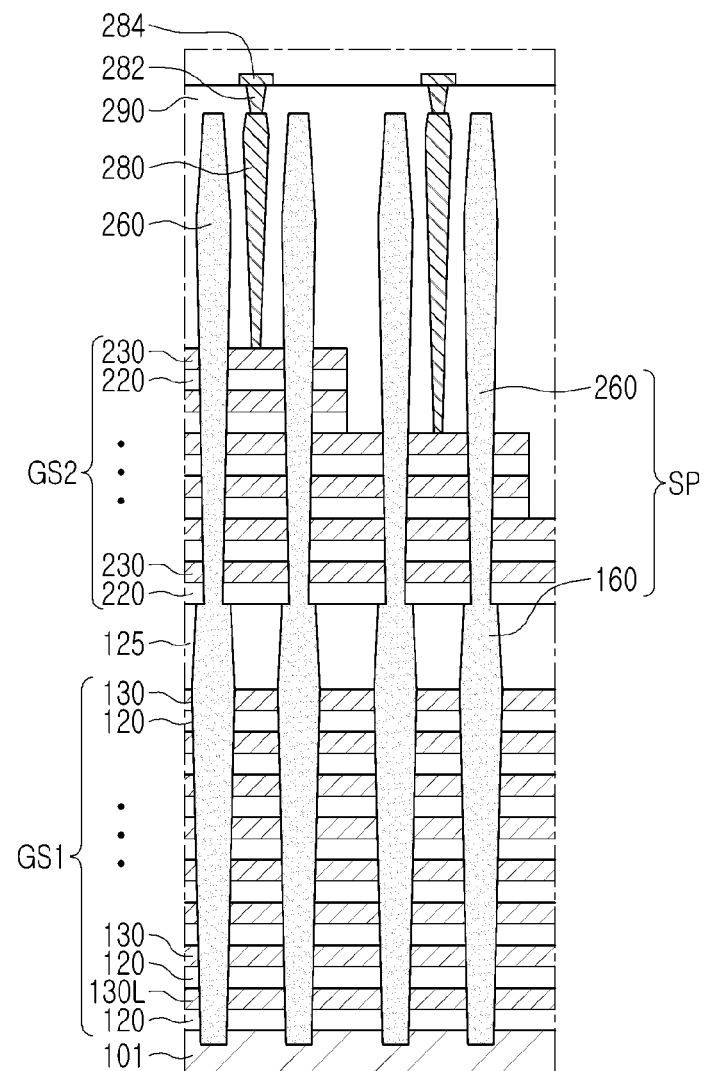
FIGS. 8A and 8B are enlarged cross-sectional views illustrating a portion of a semiconductor device according to example embodiments of the present disclosure.
Figure 8B:
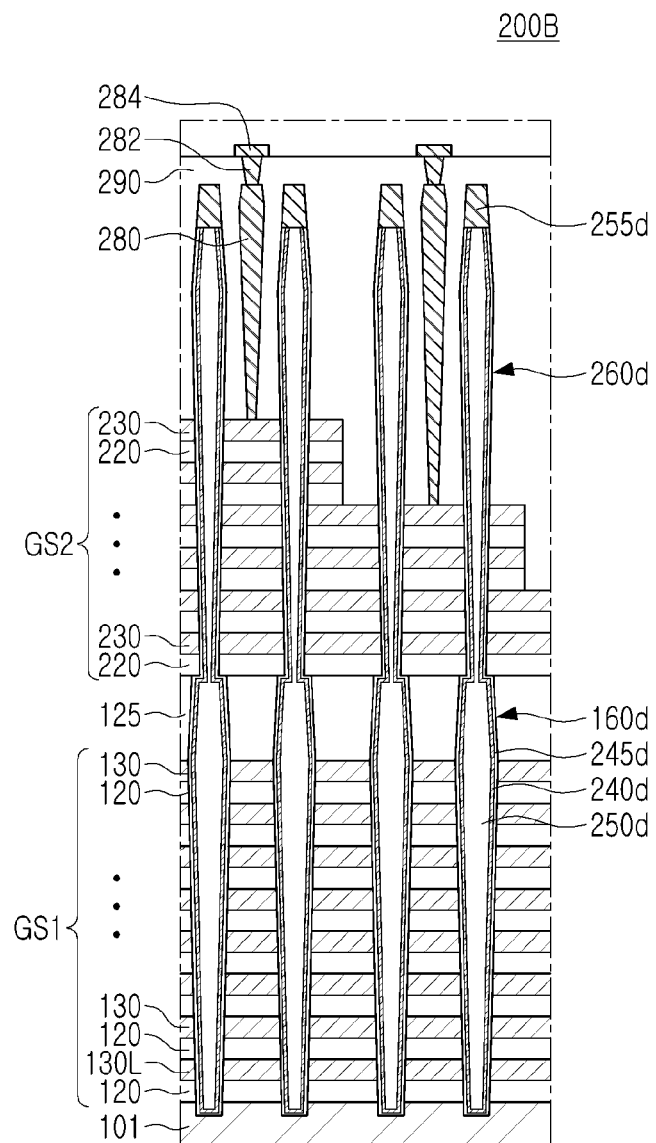

FIGS. 8A and 8B are enlarged cross-sectional views illustrating a portion of a semiconductor device according to example embodiments, illustrating a region corresponding to FIG. 7.

Referring to FIG. 8A, a semiconductor device 200A may include a support structure SP formed by connecting and integrating the first support structure 160 and the second support structure 260. The support structure SP may be formed by forming a first support layer, removing the first support layer through a through hole for exposing an upper portion of the first support layer, and filling an insulating material in the region from which the first support layer is removed and in the through hole. The first support layer may include an insulating material or a conductive material.

Referring to FIG. 8B, the first support structure 160d and the second support structure 260d may have a structure the same as or similar to the channel structure CH. For example, referring to FIG. 3C or 4A, the first support structure 160d and the second support structure 260d may be formed in the same process in which the channel structure CH is formed, and may include a channel layer 240d, a channel insulating layer 250d, a channel pad 255d, and a gate dielectric layer 245d. In this case, the channel layer 240d may be a dummy channel layer. According to example embodiments, the first support structure 160d may further include an epitaxial layer in contact with the second substrate 101 in a lower portion, and may penetrate the second horizontal conductive layer 104 and the horizontal insulating layer 110 and may be in contact with the second substrate 101.

Figure 9:
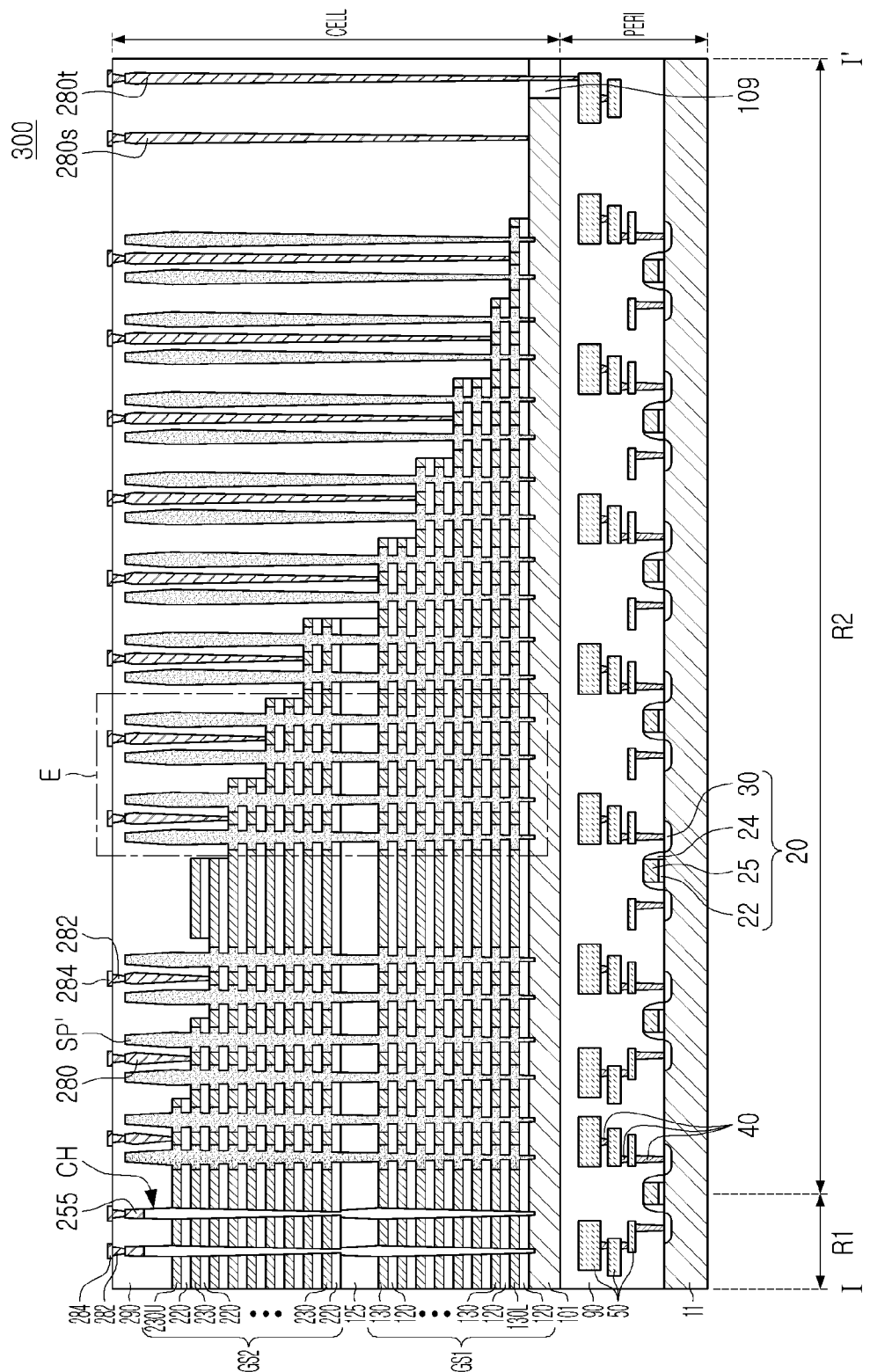
FIG. 9 is a cross-sectional view illustrating a semiconductor device according to an example embodiment of the present disclosure.

FIG. 9 is a cross-sectional view illustrating a semiconductor device according to an example embodiment, illustrating a region corresponding to FIG. 2.

Figure 10:
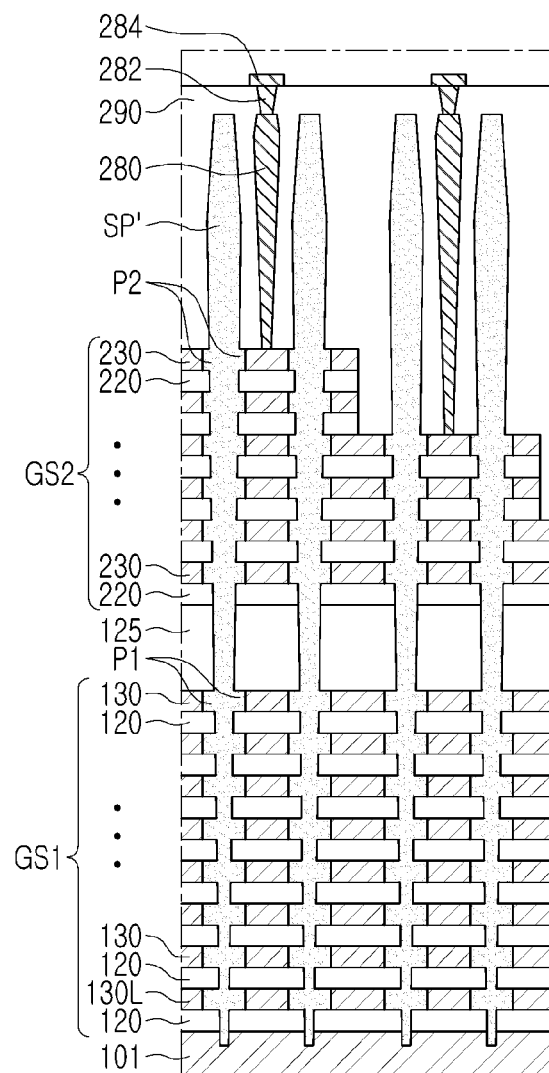
FIG. 10 is an enlarged cross-sectional view illustrating a portion of a semiconductor device according to an example embodiment of the present disclosure.

FIG. 10 is an enlarged cross-sectional view illustrating a portion of a semiconductor device according to an example embodiment, illustrating a region "E" in FIG. 9.

Referring to FIGS. 9 and 10, a semiconductor device 300 may include a peripheral circuit structure PERI and a memory cell structure CELL similarly to the aforementioned example embodiment described with reference to FIGS. 1, 2, and 3A to 3C, and may include a support structure SP' including a plurality of first protrusions P1 and a plurality of second protrusions P2, instead of the first and second support structures. The first protrusions P1 may be disposed in the first stack structure GS1 and may protrude in a horizontal direction toward lateral surfaces of the first gate electrodes 130. The first protrusions P1 may extend in a horizontal direction between the first interlayer insulating layers 120 vertically adjacent to each other. The second protrusions P2 may be disposed in the second stack structure GS2 and may protrude in a horizontal direction toward lateral surfaces of the second gate electrodes 230. The second protrusions P2 may extend in a horizontal direction between the second interlayer insulating layers 220 vertically adjacent to each other. A portion of the support structures SP' may only include the first protrusions P1. Ends of the first protrusions P1 and ends of the second protrusions P2 may or may not be aligned in the Z direction. Since the support structure SP' includes the first protrusions P1 and the second protrusions P2, the lower stack structure of the first interlayer insulating layers 120 and the upper stack structure of the second interlayer insulating layers 220 may be secured.

Figure 11A:
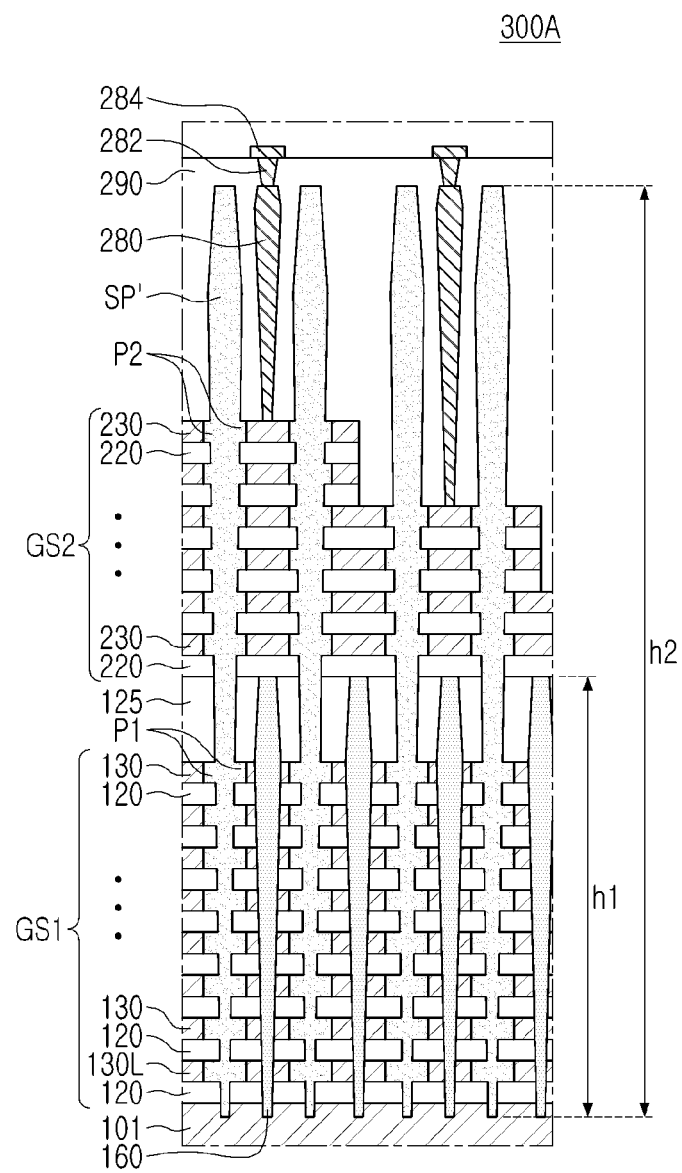
FIGS. 11A to 11C are enlarged cross-sectional views illustrating a portion of a semiconductor device according to example embodiments of the present disclosure.
Figure 11B:
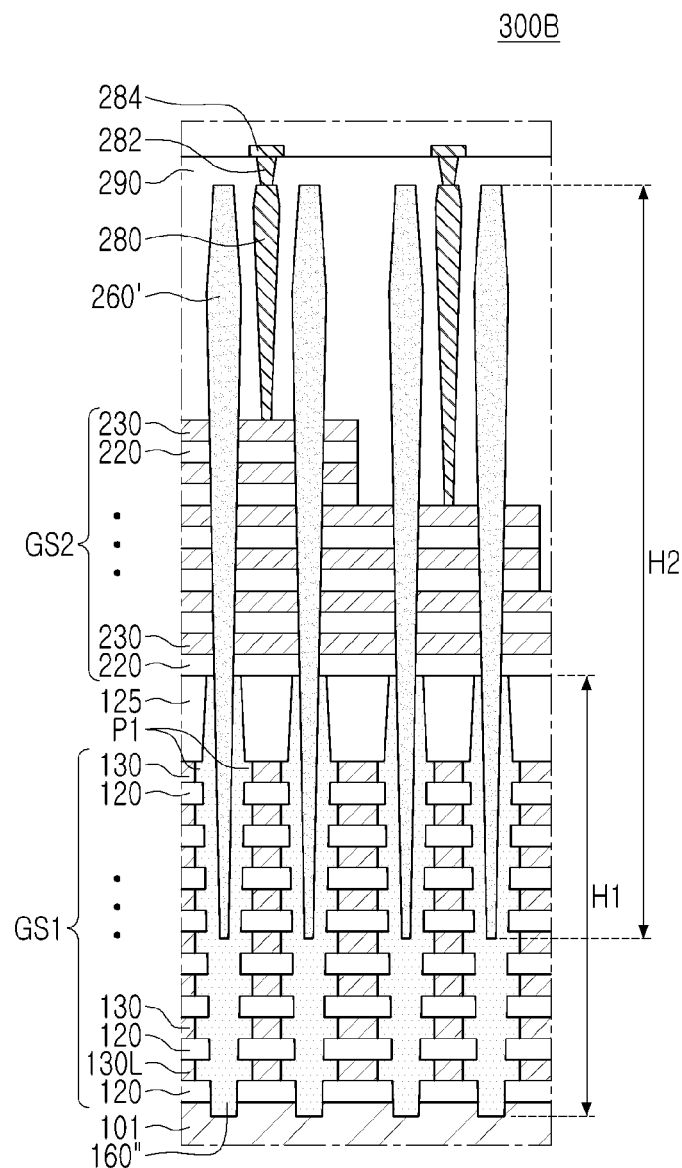
Figure 11C:
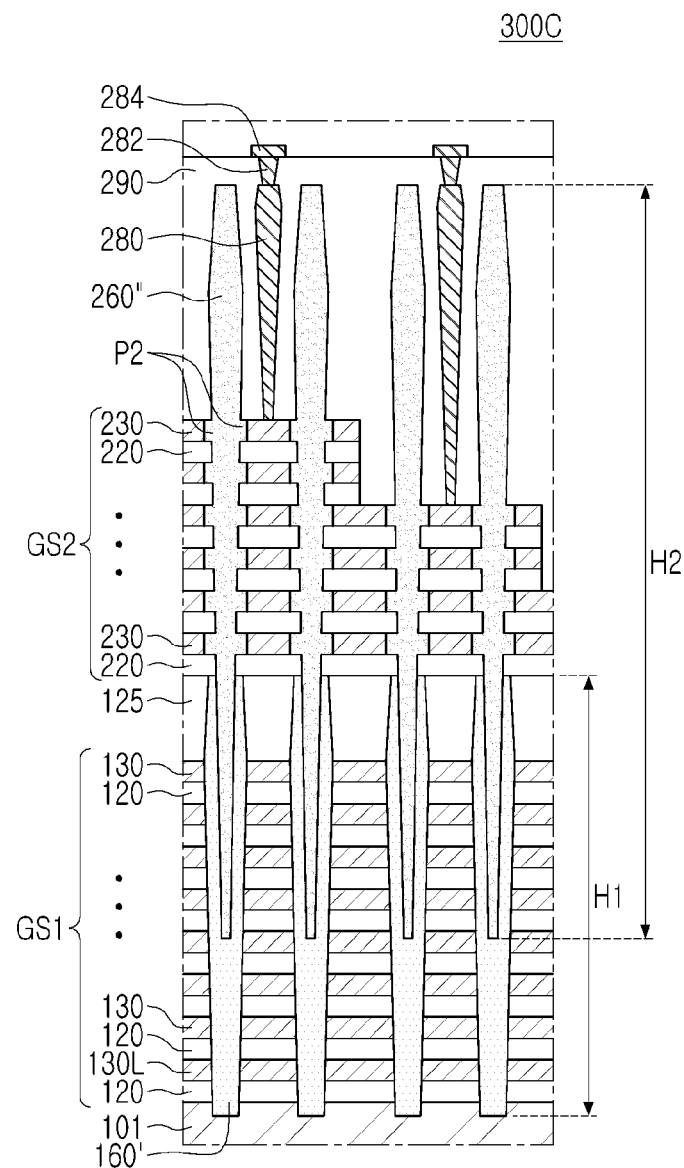

FIGS. 11A to 11C are enlarged cross-sectional views illustrating a portion of a semiconductor device according to example embodiments, illustrating regions corresponding to FIG. 10.

Referring to FIG. 11A, a semiconductor device 300A may further include a lower support structure 160 disposed between support structures SP' including protrusions P1 and P2. The lower support structure 160 may correspond to the first support structure 160 in FIG. 2. The lower support structure 160 may have a first height h1, a vertical length between an upper end and a lower end, and the support structure SP' may have a second height h2, a vertical length between an upper end and a lower end. The first height h1 may be smaller than the second height h2. The lower support structure 160 may be disposed to penetrate the first stack structure GS1, and may improve structural stability of the lower stack structure of the first interlayer insulating layer 120.

Referring to FIG. 11B, in a semiconductor device 300B, the first support structure 160' in FIG. 7 may include a plurality of protrusions P1, the second support structure 260' may overlap the first support structure 160", and a lower end of the second support structure 260' may be disposed at a level between an upper end and a lower end of the first support structure 160". The second support structure 260' may include a portion in contact with the first support structure 160". The first support structure 160" may have a first height H1, a vertical length between an upper end and a lower end, and the second support structure 260' may have a second height H2, a vertical length between an upper end and a lower end. The first height H1 may be smaller than the second height H2. Since the first support structure 160" includes the plurality of protrusions P1, structural stability of the lower stack structure of the first interlayer insulating layer 120 may improve.

Referring to FIG. 11C, in a semiconductor device 300C, the second support structure 260' in FIG. 7 may include a plurality of protrusions P2, the second support structure 260" may be disposed to overlap the first support structure 160', and a lower end of the second support structure 260" may be disposed at a level between an upper end and a lower end of the first support structure 160'. The first support structure 160' may have a first height H1, a vertical length between an upper end and a lower end, and the second support structure 260" may have a second height H2, a vertical length between an upper end and a lower end. The first height H1 may be smaller than the second height H2. The first support structure 160' may be configured to have a relatively large width to improve structural stability of the lower stack structure of the first interlayer insulating layers 120, and the second support structure 260" may include the plurality of protrusions, such that structural stability of the upper stack structure of the second interlayer insulating layer 220 may improve.

Figure 12A:
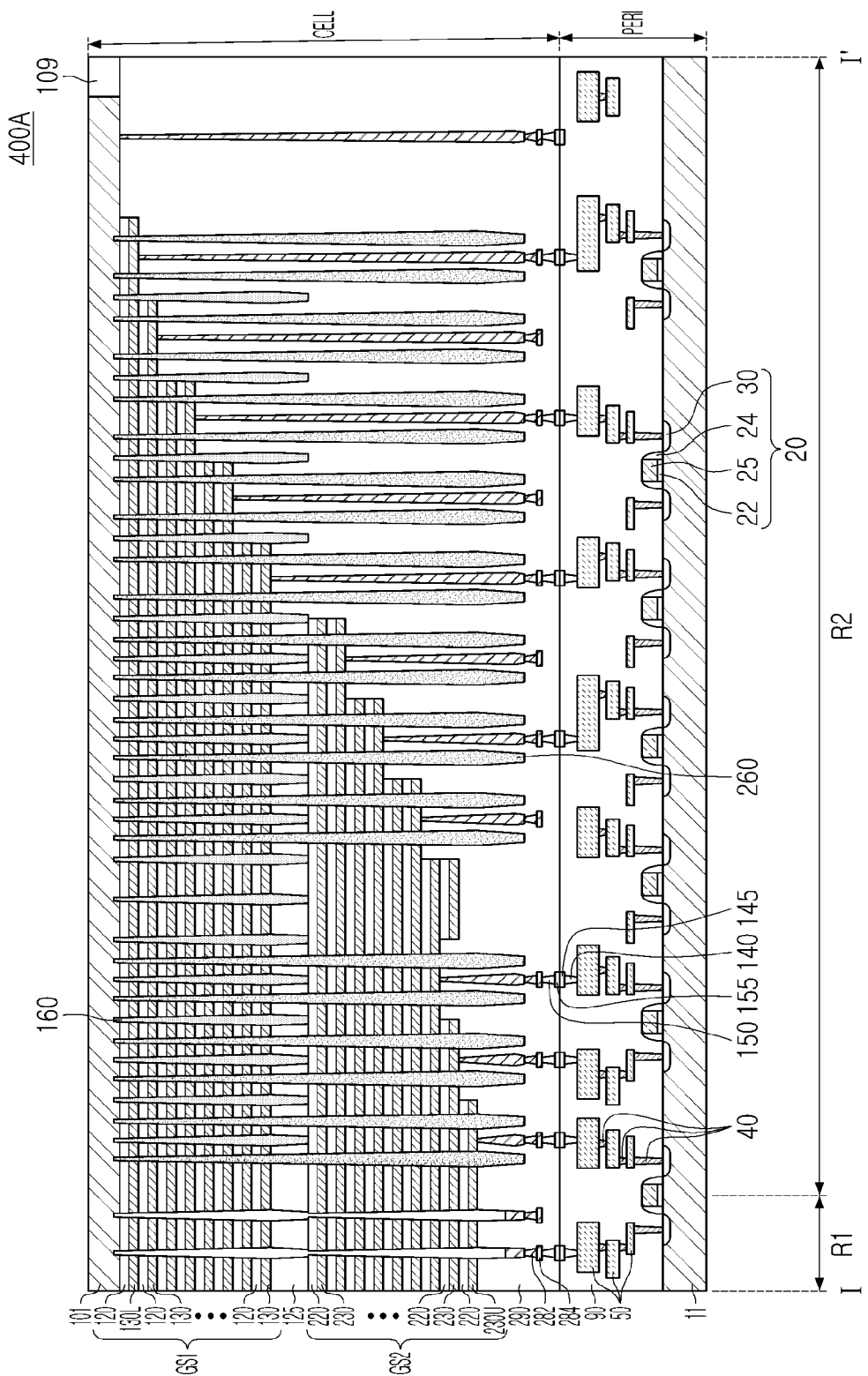
FIGS. 12A to 12C are cross-sectional views illustrating a semiconductor device according to example embodiments of the present disclosure.
Figure 12B:
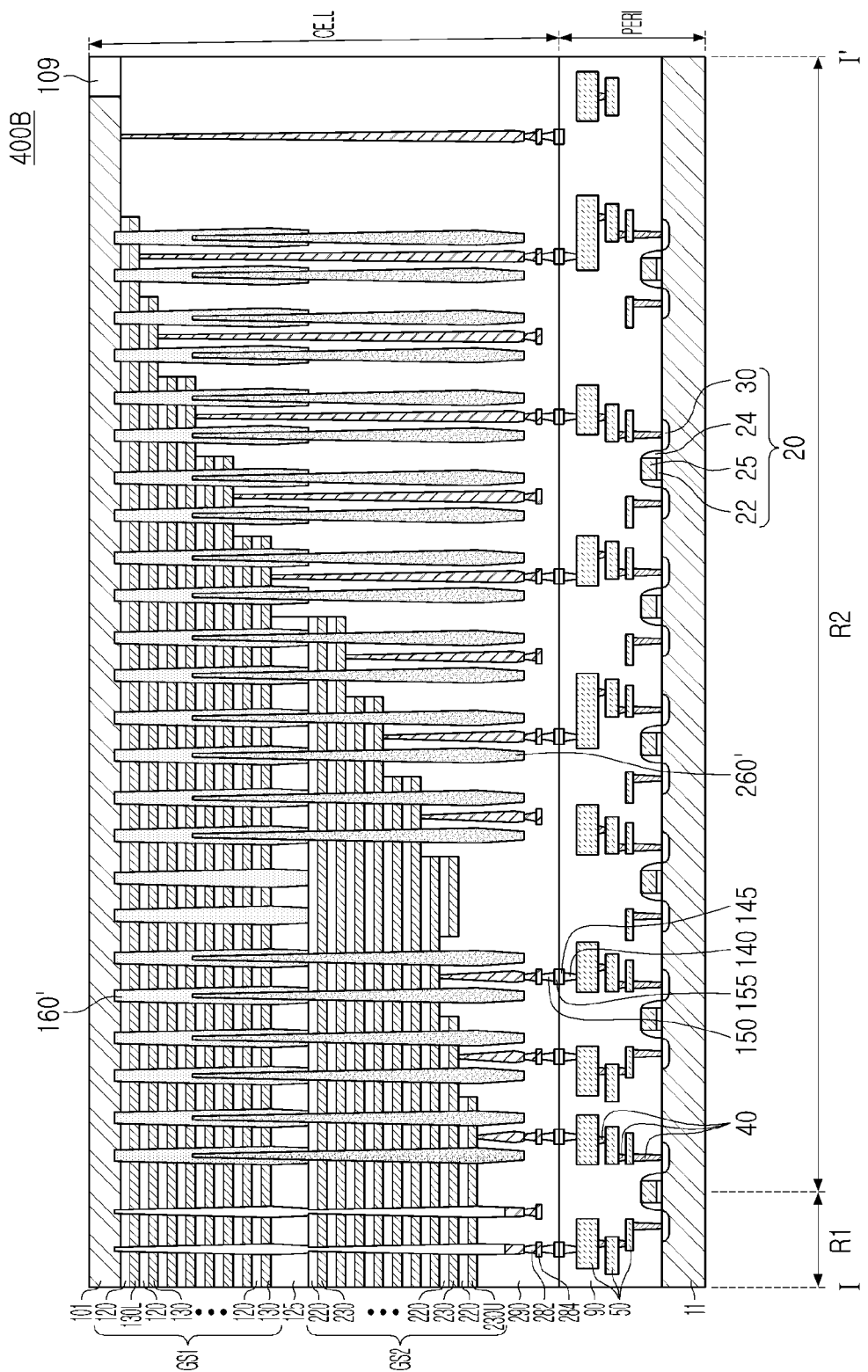
Figure 12C:
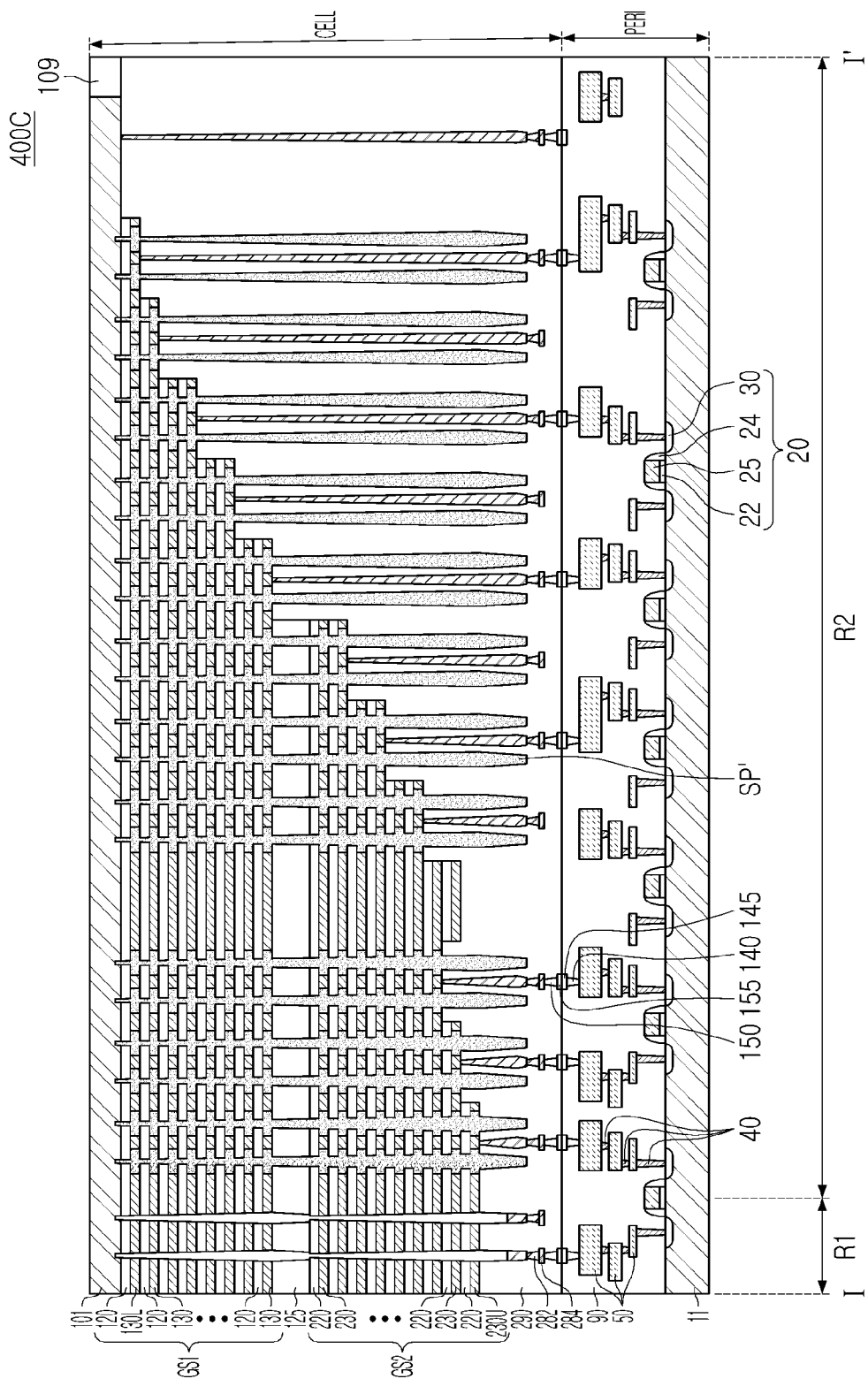

FIGS. 12A to 12C are cross-sectional views illustrating a semiconductor device according to example embodiments.

Referring to FIG. 12A, in a semiconductor device 400A, the memory cell structure CELL including the first support structure 160 and the second support structure 260 and the peripheral circuit structure PERI, described in the aforementioned example embodiment with reference to FIG. 2, may be bonded to each other through a bonding structure. Differently from the memory cell structure CELL of the semiconductor device 100, the memory cell structure CELL of the semiconductor device 400A in FIG. 12A may be disposed upside down, and may further include upper bonding structures 150 and 155 connected to the upper wirings 284. The peripheral circuit structure PERI may further include lower bonding structures (or, first bonding structures) 140 and 145 bonded to the upper bonding structures (or, second bonding structures) 150 and 155 and connected to the circuit wiring lines 50.

The lower bonding structures 140 and 145 may include a lower bonding via 140 connected to circuit wiring lines 50 and a lower bonding pad 145 connected to the lower bonding via 140. The upper bonding structures 150 and 155 may include an upper bonding via 150 connected to the upper wirings 284 and an upper bonding pad 155 connected to the upper bonding via 150. The lower bonding structures 140 and 145 and the upper bonding structures 150 and 155 may include, for example, tungsten (W), aluminum (Al), copper (Cu), tungsten nitride (WN), tantalum nitride (TaN), titanium nitride (TiN), or a combination thereof. The lower bonding pad 145 and the upper bonding pad 155 may function as bonding layers for bonding the peripheral circuit structure PERI to the memory cell structure CELL. Also, the lower bonding pad 145 and the upper bonding pad 155 may provide an electrical connection path between the peripheral circuit structure PERI and the memory cell structure CELL.

Referring to FIG. 12B, in a semiconductor device 400B, the memory cell structure CELL in the semiconductor device 400A in FIG. 12A may correspond to the memory cell structure CELL of the semiconductor device 200 in FIG. 6. In an example embodiment, the memory cell structure CELL may correspond to the memory cell structure CELL of the semiconductor device in FIGS. 8A and 8B.

Referring to FIG. 12C, in a semiconductor device 400C, the memory cell structure CELL in the semiconductor device 400A in FIG. 12A may correspond to the memory cell structure CELL of the semiconductor device 300 in FIG. 9. In an example embodiment, the memory cell structure CELL may correspond to the memory cell structure CELL of the semiconductor device in FIGS. 11A to 11C.

FIGS. 13A to 13F are cross-sectional views illustrating a method of manufacturing a semiconductor device according to example embodiments, illustrating regions corresponding to FIG. 2.

Figure 13A:
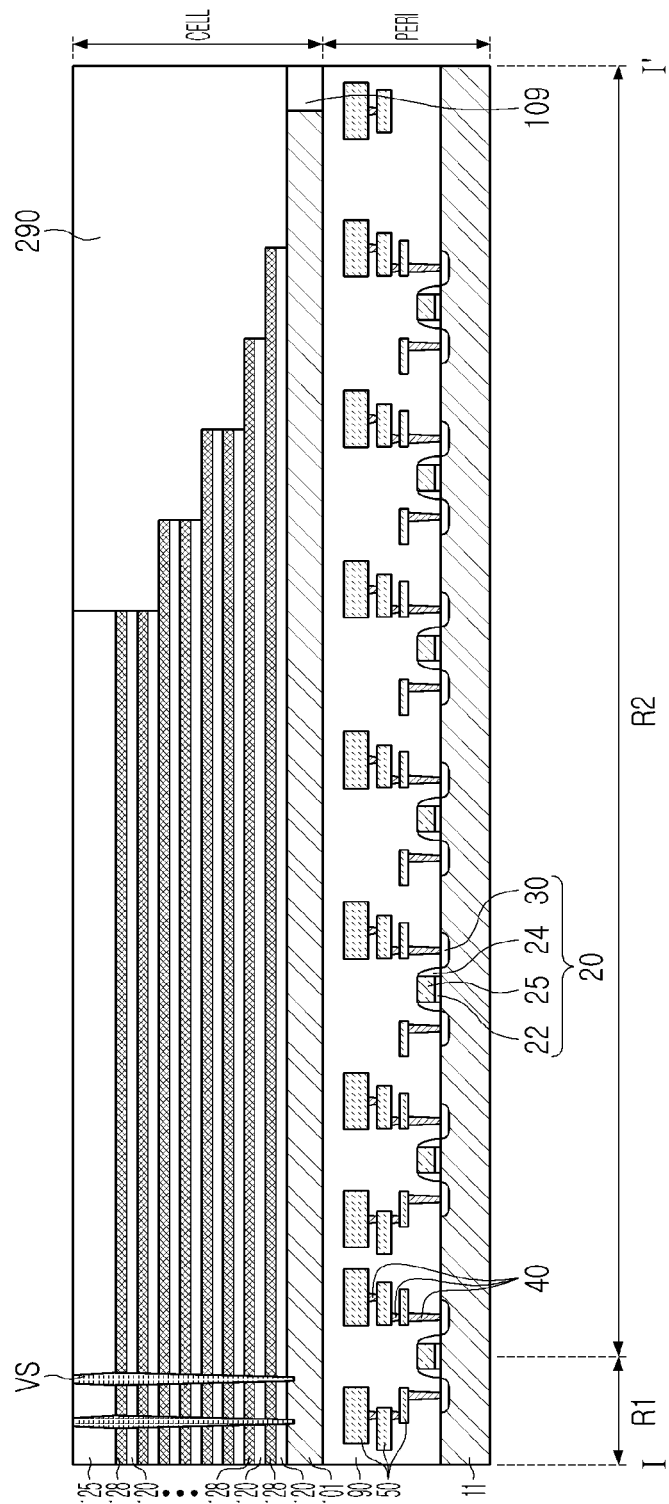
FIGS. 13A to 13F are cross-sectional views illustrating a method of manufacturing a semiconductor device according to example embodiments of the present disclosure.

Referring to FIG. 13A, a peripheral circuit structure PERI including circuit devices 20 and circuit wiring structures may be formed on a first substrate 11, a second substrate 101 in which a memory cell region is provided may be formed above the peripheral circuit structure PERI, first sacrificial insulating layers 128 and first interlayer insulating layers 120 may be alternately stacked on the second substrate 101, and a vertical sacrificial structure VS penetrating the stack structure of the first sacrificial insulating layers 128 and the first interlayer insulating layers 120 may be formed.

The circuit gate dielectric layer 22 and the circuit gate electrode 25 may be formed in order on the first substrate 11. The circuit gate dielectric layer 22 may be formed of silicon oxide, and the circuit gate electrode 25 may be formed of at least one of polysilicon or metal silicide layers, but an example embodiment thereof is not limited thereto. Thereafter, a spacer layer 24 and source/drain regions 30 may be formed on both sidewalls of the circuit gate dielectric layer 22 and the circuit gate electrode 25. In example embodiments, the spacer layer 24 may include a plurality of layers.

Thereafter, the source/drain regions 30 may be formed by performing an ion implantation process.

Among the lower wiring structures, the circuit contact plugs 40 may be formed by partially forming the peripheral region insulating layer 90, removing a portion thereof by etching, and filling a conductive material therein. The circuit wiring lines 50 may be formed by depositing a conductive material and patterning the conductive material.

The peripheral region insulating layer 90 may be formed of a plurality of insulating layers. A portion of the peripheral region insulating layer 90 may be formed in the processes of forming the lower wiring structures and the other portion thereof may be formed above an uppermost circuit wiring line 50, such that the peripheral region insulating layer 90 may be formed to cover the circuit devices 20 and the lower wiring structures.

The second substrate 101 may be formed on the peripheral region insulating layer 90. At least a portion of the second substrate 101 may include a polycrystalline silicon layer. The second substrate 101 may include a polysilicon layer having n-type conductivity. The second substrate 101 may be formed to have a size smaller than or the same as that of the first substrate 11.

In an example embodiment, the first sacrificial insulating layers 128 may be partially replaced with the first gate electrodes 130 (see FIG. 2) through a subsequent process. The first sacrificial insulating layers 128 may be formed of a material different from the first interlayer insulating layers 120, and may be formed of a material etched with etch selectivity with respect to the first interlayer insulating layers 120 under specific etching conditions. For example, the first interlayer insulating layer 120 may be formed of silicon oxide, and the first sacrificial insulating layers 128 may be formed of a material different from a material of the first interlayer insulating layer 120 selected from among silicon, silicon carbide, and silicon nitride. In example embodiments, at least a portion of the first interlayer insulating layers 120 may have a thickness different from that of the other first interlayer insulating layers. The thicknesses of the first interlayer insulating layers 120 and the first sacrificial insulating layers 128 and the number of layers thereof may be varied from the illustrated example. A connection insulating layer 125 may be further formed on the uppermost first sacrificial insulating layers 128. The connection insulating layer 125 may include a material having etch selectivity with respect to the first sacrificial insulating layers 128, the same material as that of the first interlayer insulating layers 120, for example.

In the second region R2 of the second substrate 101, a photolithography process and an etching process for the first sacrificial insulating layers 128 may be repeatedly performed using a mask layer so as to configure the upper first sacrificial insulating layers 128 to extend less than the lower first sacrificial insulating layers 128. Accordingly, the first sacrificial insulating layers 128 may have staircase form.

A portion of the capping insulating layer 290 covering an upper portion of the stack structure of the first sacrificial insulating layers 128 and the first interlayer insulating layers 120 may be formed.

A lower channel hole penetrating the stack structure of the first sacrificial insulating layers 128 and the first interlayer insulating layers 120 may be formed, and a sacrificial layer may be formed in the lower channel hole to form a vertical sacrificial structure VS. The sacrificial layer may include a semiconductor material such as polycrystalline silicon or single crystal silicon, and the semiconductor material may be an undoped material.

In this process, to manufacture the semiconductor device in FIGS. 4A and 4B, a horizontal insulating layer 110 including a first to third horizontal insulating layers 111, 112 and 113 and a second horizontal conductive layer 104 may be formed. The second horizontal insulating layer 112 may be formed of a material having etch selectivity with respect to the first and third horizontal insulating layers 111 and 113. For example, the first and third horizontal insulating layers 111 and 113 may be formed of silicon oxide, and the second horizontal insulating layer 112 may be formed of silicon nitride. The second horizontal conductive layer 104 may be formed of a semiconductor material.

In this process, a substrate insulating layer 109 penetrating the second substrate 101 may be formed in a region corresponding to the through insulating region IR described in FIG. 5. After the substrate insulating layer 109 is formed, a planarization process may be further performed using a chemical mechanical polishing (CMP) process.

Figure 13B:
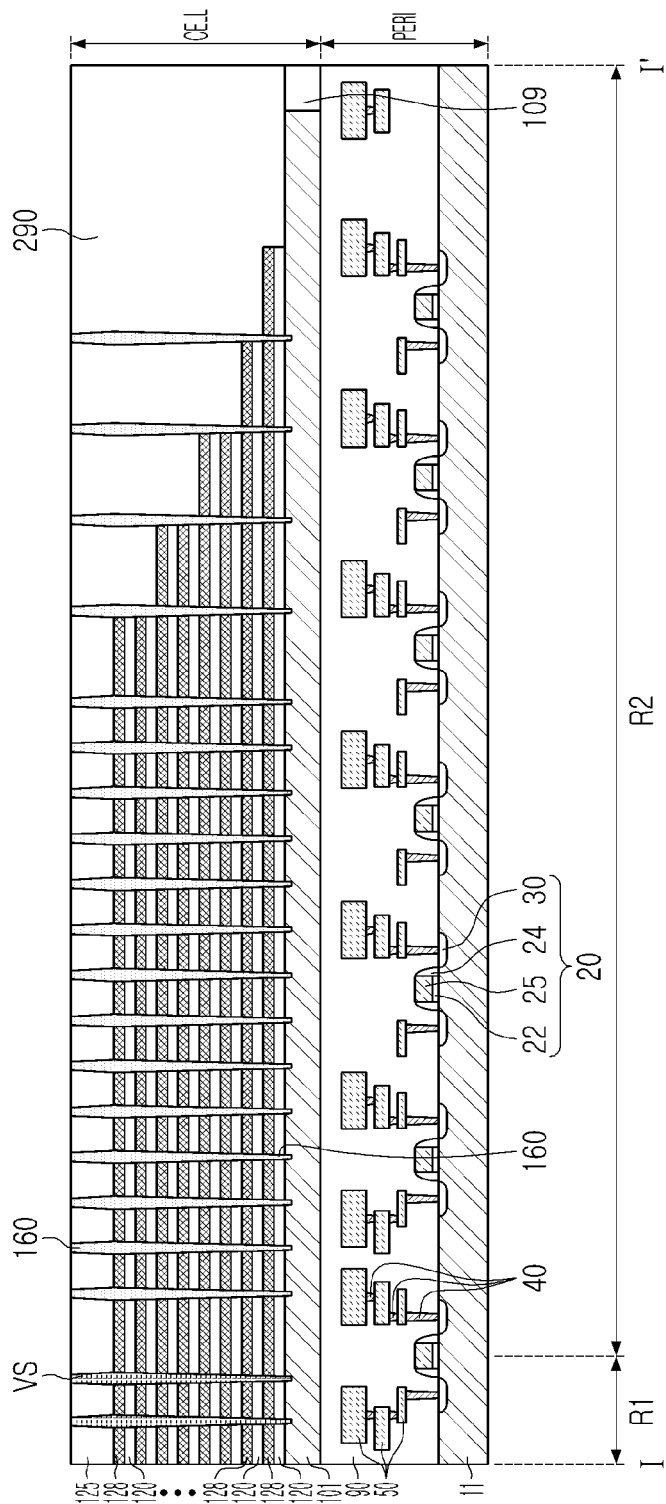

Referring to FIG. 13B, a first support structure 160 penetrating the lower stack structure of the first sacrificial insulating layers 128 and the first interlayer insulating layers 120 may be formed.

The first support structure 160 may be formed by forming a through hole penetrating the stack structure of the first sacrificial insulating layers 128 and the first interlayer insulating layers 120 and filling the through hole with an insulating material. An upper end of the first support structure 160 may be disposed at the same level as a level of the upper end of the vertical sacrificial structure VS, or may be disposed at a level higher than the level of the upper end of the vertical sacrificial structure VS. The first support structure 160 may be formed in a process separate from the process of forming the vertical sacrificial structure VS, but an example embodiment thereof is not limited thereto.

Figure 13C:
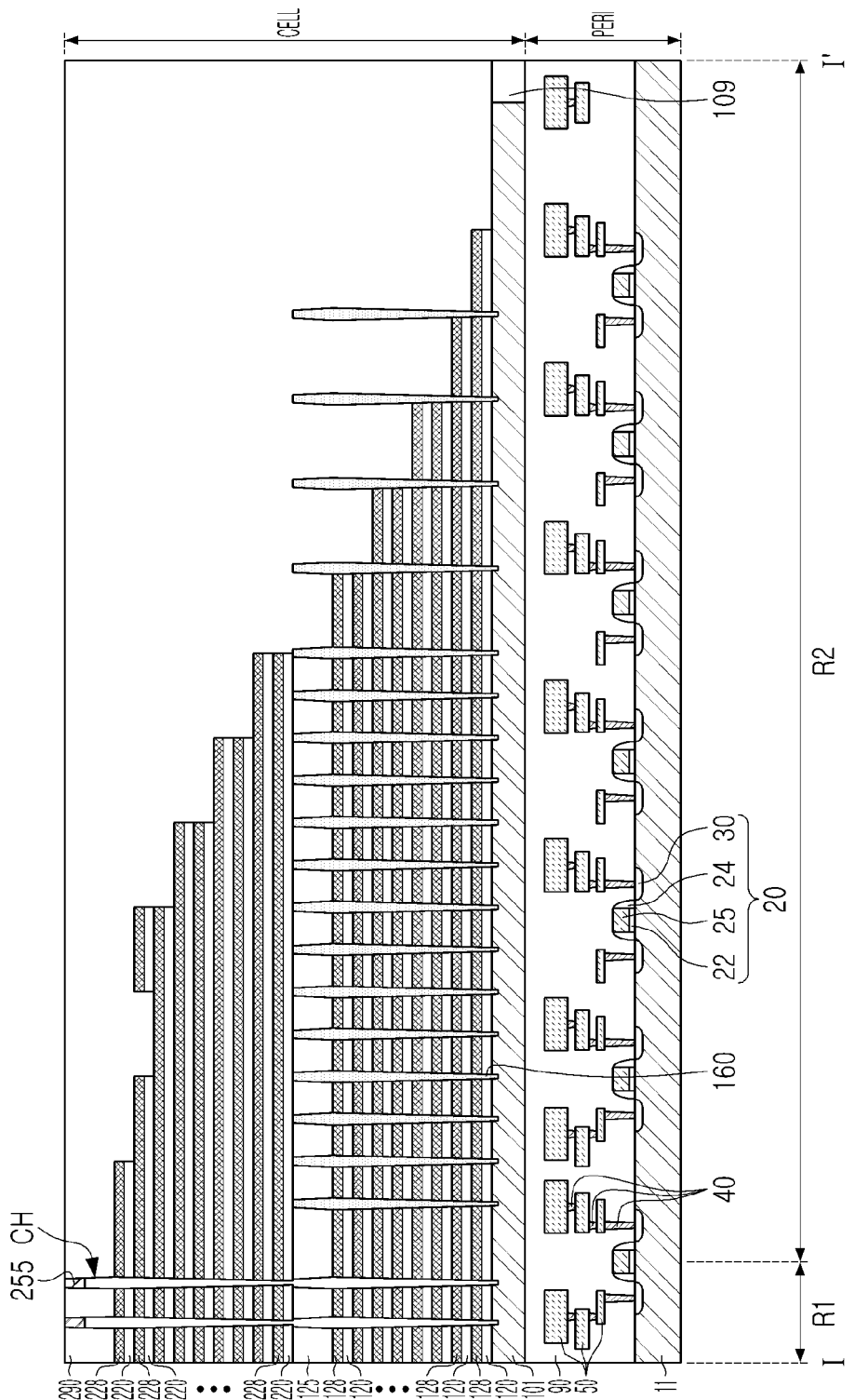

Referring to FIG. 13C, second sacrificial insulating layers 228 and second interlayer insulating layers 220 may be alternately stacked on the lower stack structure of the first sacrificial insulating layers 128 and the first interlayer insulating layers 120, and channel structures CH may be formed.

The second sacrificial insulating layers 228 may be partially replaced with second gate electrodes 230 (see FIG. 2) through a subsequent process. The second sacrificial insulating layers 228 may be formed of a material different from a material of the second interlayer insulating layers 220, and may be formed of a material etched with etch selectivity with respect to the second interlayer insulating layers 220 under specific etching conditions. For example, the second interlayer insulating layer 220 may be formed of silicon oxide, and the second sacrificial insulating layers 228 may be formed of silicon nitride, and the second sacrificial insulating layers 228 may be formed of a material different from a material of the second interlayer insulating layer 220 selected from among silicon, silicon carbide, and silicon nitride. In example embodiments, the thicknesses of the second interlayer insulating layers 220 may not be the same. The thicknesses of the second interlayer insulating layers 220 and the second sacrificial insulating layers 228 and the number of layers thereof may be varied from the illustrated examples.

In the second region R2 of the second substrate 101, a photolithography process and an etching process for the second sacrificial insulating layers 228 may be repeatedly performed using a mask layer so as to configure the upper second sacrificial insulating layers 228 to extend less than the lower second sacrificial insulating layers 228. Accordingly, the second sacrificial insulating layers 228 may have staircase form.

A portion of the capping insulating layer 290 covering the upper stack structure of the second sacrificial insulating layers 228 and the second interlayer insulating layers 220 may be formed.

On the vertical sacrificial structure VS, the upper stack structure may be anisotropically etched to form an upper channel hole, and the vertical sacrificial structure VS exposed through the upper channel hole may be removed. Accordingly, a channel hole in which the lower channel hole is connected to the upper channel hole may be formed.

Channel structures CH may be formed by forming an epitaxial layer 205, a channel layer 240, a gate dielectric layer 245, a channel insulating layer 250, and channel pads 255 in the channel holes. The epitaxial layer 205 may be formed using a selective epitaxial growth (SEG) process. A single epitaxial layer 205 may be provided or a plurality of epitaxial layers 205 may be provided. The epitaxial layer 205 may include polycrystalline silicon, monocrystalline silicon, polycrystalline germanium, or monocrystalline germanium, doped or undoped with impurities. The gate dielectric layer 245 may be formed to have a uniform thickness. The channel layer 240 may be formed on the gate dielectric layer 245 in the channel structures CH. The channel insulating layer 250 may be formed to fill the channel structures CH, and may be configured as an insulating material. However, in example embodiments, a space between the channel layers 240 may be filled with a conductive material, rather than the channel insulating layer 250. The channel pads 255 may be formed of a conductive material, polycrystalline silicon, for example.

Figure 13D:
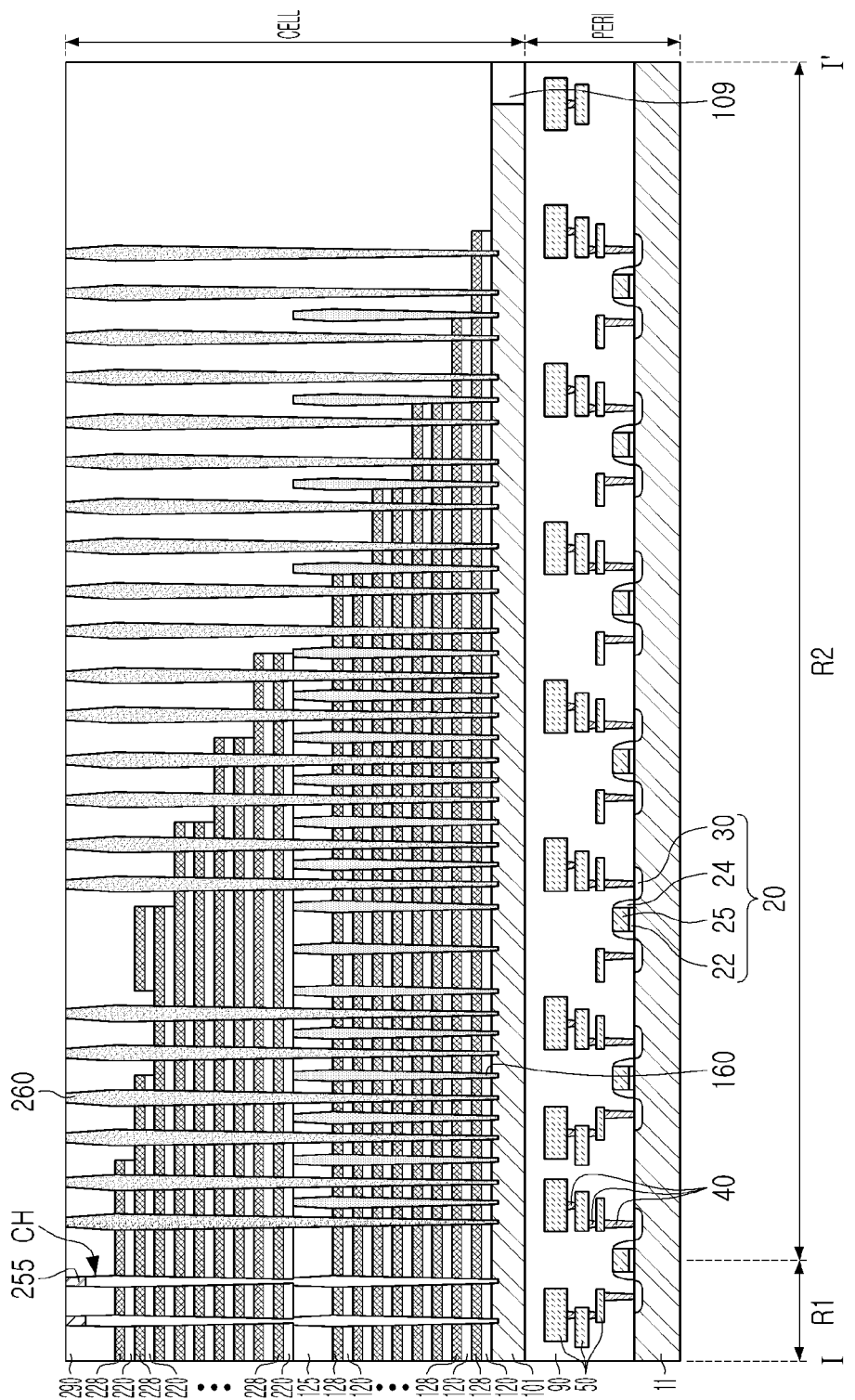

Referring to FIG. 13D, a second support structure 260 penetrating the lower stack structure of the first sacrificial insulating layers 128 and the first interlayer insulating layers 120 and the upper stack structure of the second sacrificial insulating layers 228 and the second interlayer insulating layers 220 may be formed.

The second support structure 260 may be formed by forming a through hole penetrating the lower stack structure of the first sacrificial insulating layers 128 and the first interlayer insulating layers 120 and the upper stack structure of the second sacrificial insulating layers 228 and the second interlayer insulating layers 220 and filling an insulating material in the through hole. An upper end of the second support structure 260 may be disposed at the same level as a level of the upper end of the channel structure CH, or may be disposed at a level higher than the level of the upper end of the channel structure CH. The second support structure 260 may be formed in a process separate from the process of forming the channel structure CH, but an example embodiment thereof is not limited thereto.

Figure 13E:
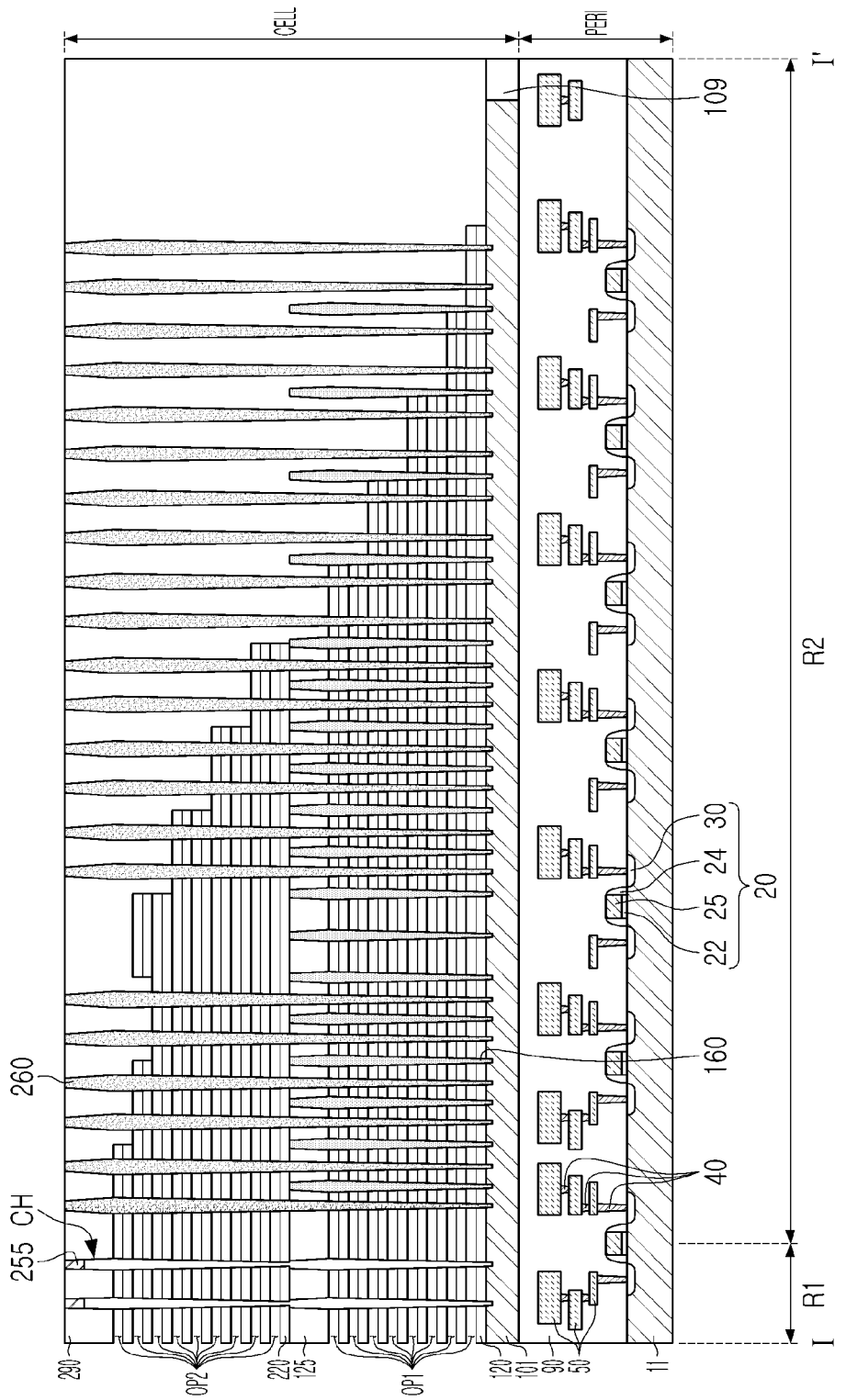

Referring to FIG. 13E, an opening penetrating the lower stack structure of the first sacrificial insulating layers 128 and the first interlayer insulating layers 120 and the upper stack structure of the second sacrificial insulating layers 228 and the second interlayer insulating layers 220 may be formed, and the first and second sacrificial insulating layers 128 and 228 may be removed through the opening.

The opening may be formed in a region corresponding to the separation structure MS (see FIG. 1), and may be formed to have a trench shape extending in the X direction. The first and second sacrificial insulating layers 128 and 228 may be selectively removed with respect to the first and second interlayer insulating layers 120 and 220 using, for example, isotropic etching. Accordingly, sidewalls of the channel structures CH may be partially exposed between the first interlayer insulating layers 120 and between the second interlayer insulating layers 220. Horizontal openings OP1 and OP2 may be formed by removing the first and second sacrificial insulating layers 128 and 228.

As the first and second sacrificial insulating layers 128 and 228 are removed, the lower stack structure of the first interlayer insulating layers 120 and the upper stack structure of the second interlayer insulating layers 220 may collapse or may be tilted, such that structural stability thereof may be weakened. The first and second support structures 160 and 260 may support the lower stack structure of the first interlayer insulating layers 120 and the upper stack structure of the second interlayer insulating layers 220 in the second region R2. As the number of layers of the stack structure increases, the second support structure 260 may have an inclined surface, and a distance between the second support structures 260 adjacent to each other may increase downwardly, such that structural stability of the lower stack structure may be weakened. In the example embodiment, by additionally disposing the first support structure 160 in the region having weak structural stability, stability of the lower stack structure may be secured.

In this process, before the first and second sacrificial insulating layers 128 and 228 are removed, a portion of the horizontal insulating layer 110 and a portion the gate dielectric layer 245 may be replaced with the first horizontal conductive layer 102 through the openings on the first region R1. The horizontal insulating layer 110 may remain on the second region R2. Accordingly, the semiconductor device in FIGS. 4A and 4B may be manufactured.

Figure 13F:
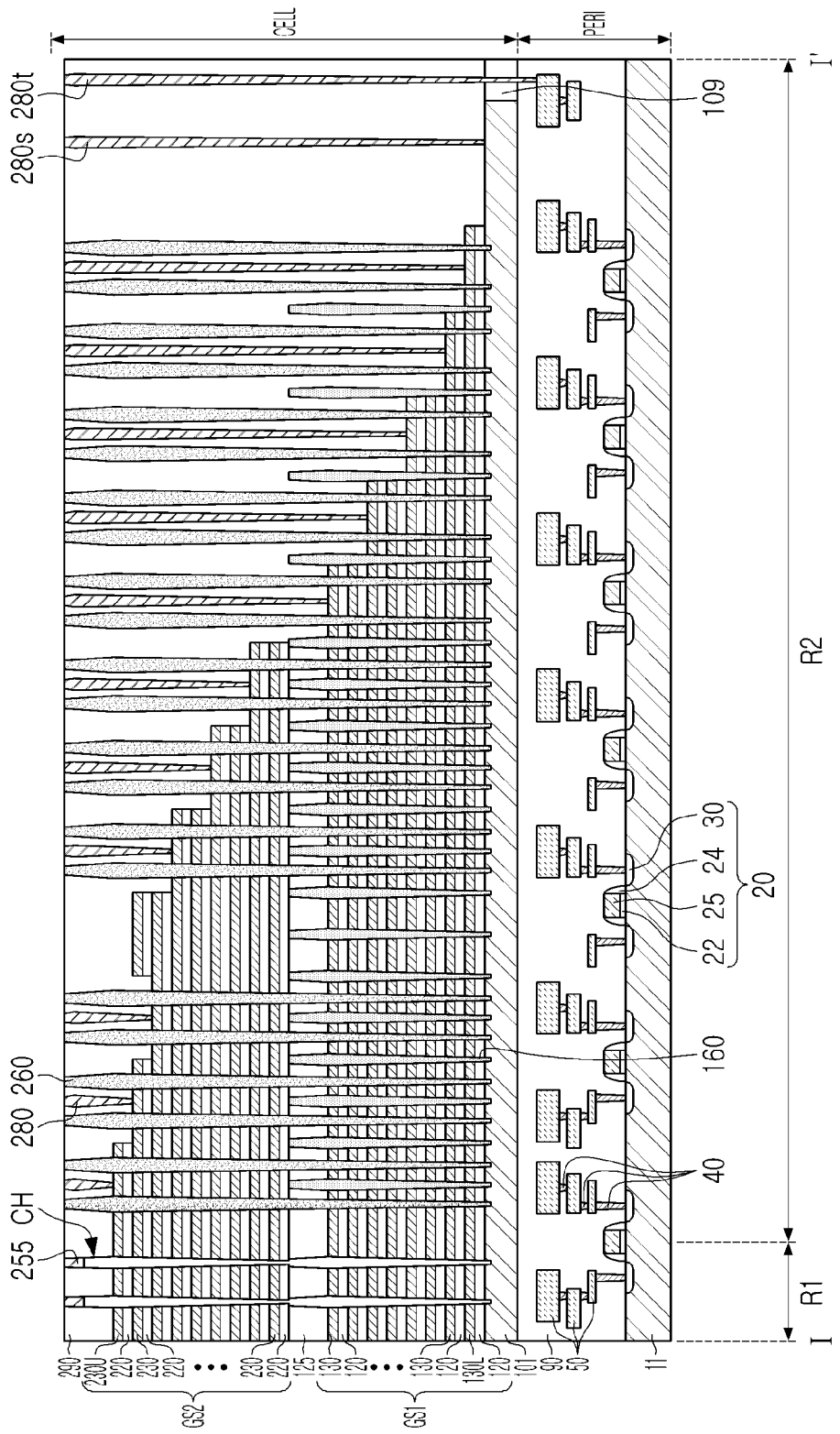

Referring to FIG. 13F, first and second gate electrodes 130 and 230 may be formed in a region from which the first and second sacrificial insulating layers 128 and 228 are removed, and contact structures 280 connected to the first and second gate electrodes 130 and 230 may be formed.

The first and second gate electrodes 130 and 230 may be formed by filling a conductive material in the region from which the first and second sacrificial insulating layers 128 and 228 are removed. The first and second gate electrodes 130 and 230 may include metal, polycrystalline silicon, or a metal silicide material. In example embodiments, before the first and second gate electrodes 130 and 230 are formed, when there is a region extending horizontally on the second substrate 101 along the first and second gate electrodes 130 and 230 of the gate dielectric layer 245, the region may be preferentially formed.

The separation structure MS may be formed by filling an insulating material in the opening.

Thereafter, contact holes penetrating the capping insulating layer 290 may be formed, and by depositing a conductive material in the contact holes, contact structures 280 may be formed.

Thereafter, by forming the upper contact structure 282 and the upper wirings 284, the semiconductor device 100 in FIG. 2 may be manufactured.

FIGS. 14A to 14D are cross-sectional views illustrating a method of manufacturing a semiconductor device according to example embodiments, illustrating regions corresponding to FIG. 6.

Figure 14A:
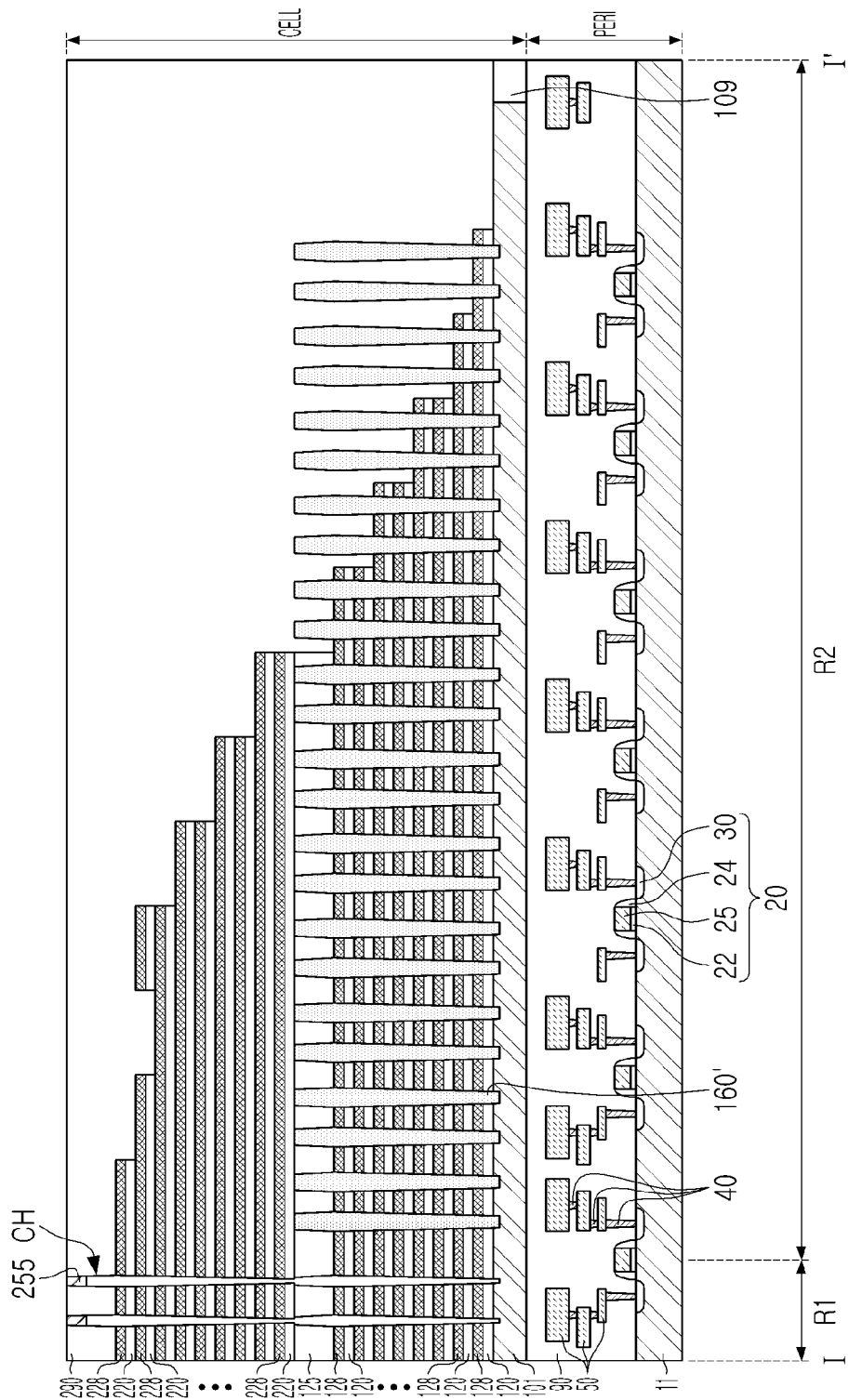
FIGS. 14A to 14D are cross-sectional views illustrating a method of manufacturing a semiconductor device according to example embodiments of the present disclosure.

Referring to FIG. 14A, similarly to the aforementioned example embodiment described with reference to FIGS. 13A to 13C, the lower stack structure including the first sacrificial insulating layers 128 and first interlayer insulating layers 120 may be formed on the peripheral circuit structure PERI, a first support structure 160' may be formed, the upper stack structure including the second sacrificial insulating layers 228 and the second interlayer insulating layers 220, and the channel structures CH may be formed. Differently from the example in FIG. 13C, the first support structure 160' may be formed to have a relatively large width, and may be formed in a position overlapping a second support structure 260' formed later.

Figure 14B:
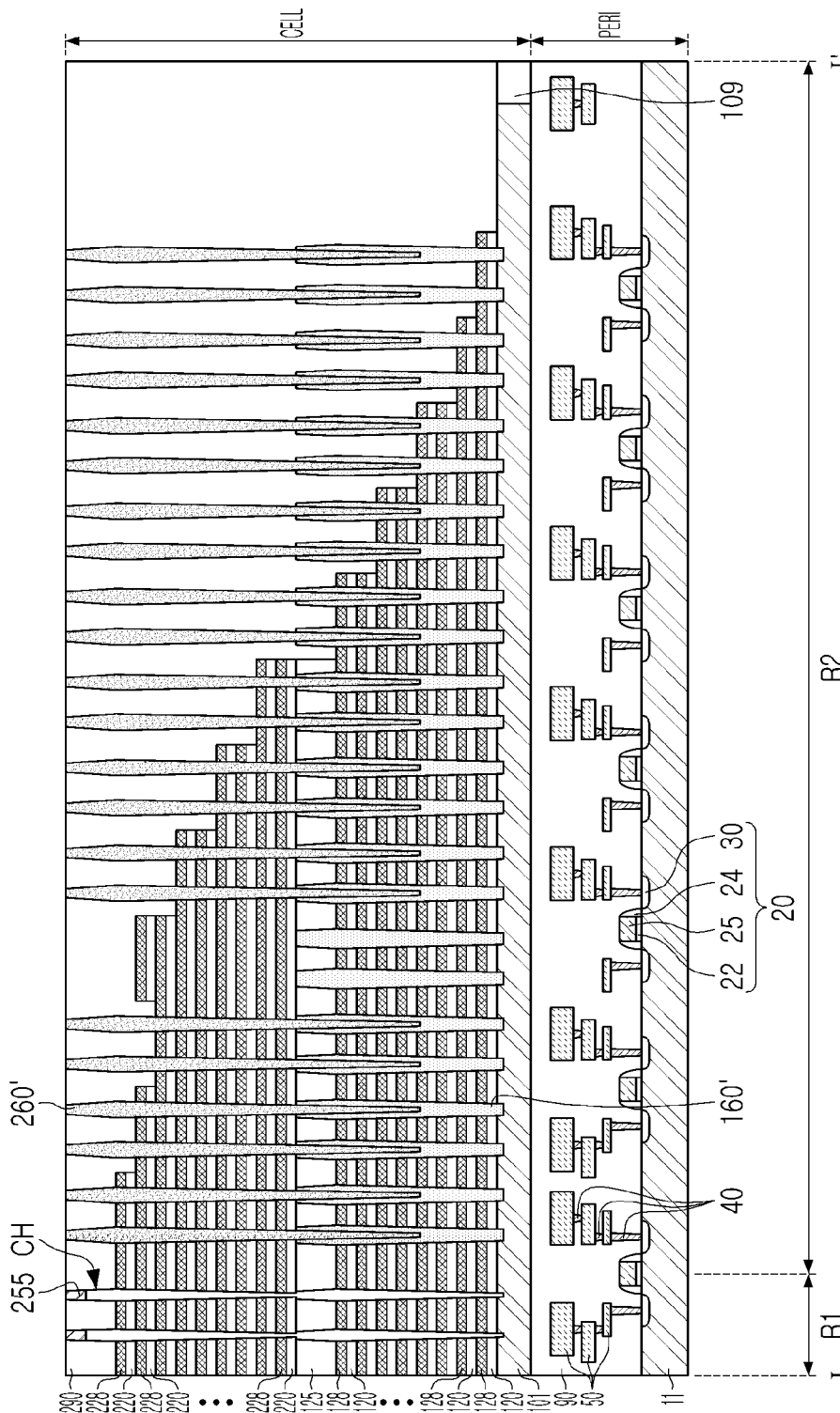

Referring to FIG. 14B, the second support structure 260' penetrating the upper stack structure of the second sacrificial insulating layers 228 and the second interlayer insulating layers 220 and penetrating a portion of the first support structure 160' from an upper portion may be formed. A through hole penetrating the upper stack structure of the second sacrificial insulating layers 228 and the second interlayer insulating layers 220 may be formed, and thereafter, by filling an insulating material in the through hole, the second support structure 260' may be formed. In this case, the through hole may penetrate a portion of the first support structure 160', and a lower end thereof may be disposed at a level between the upper end and the lower end of the first support structure 160'.

Figure 14C:
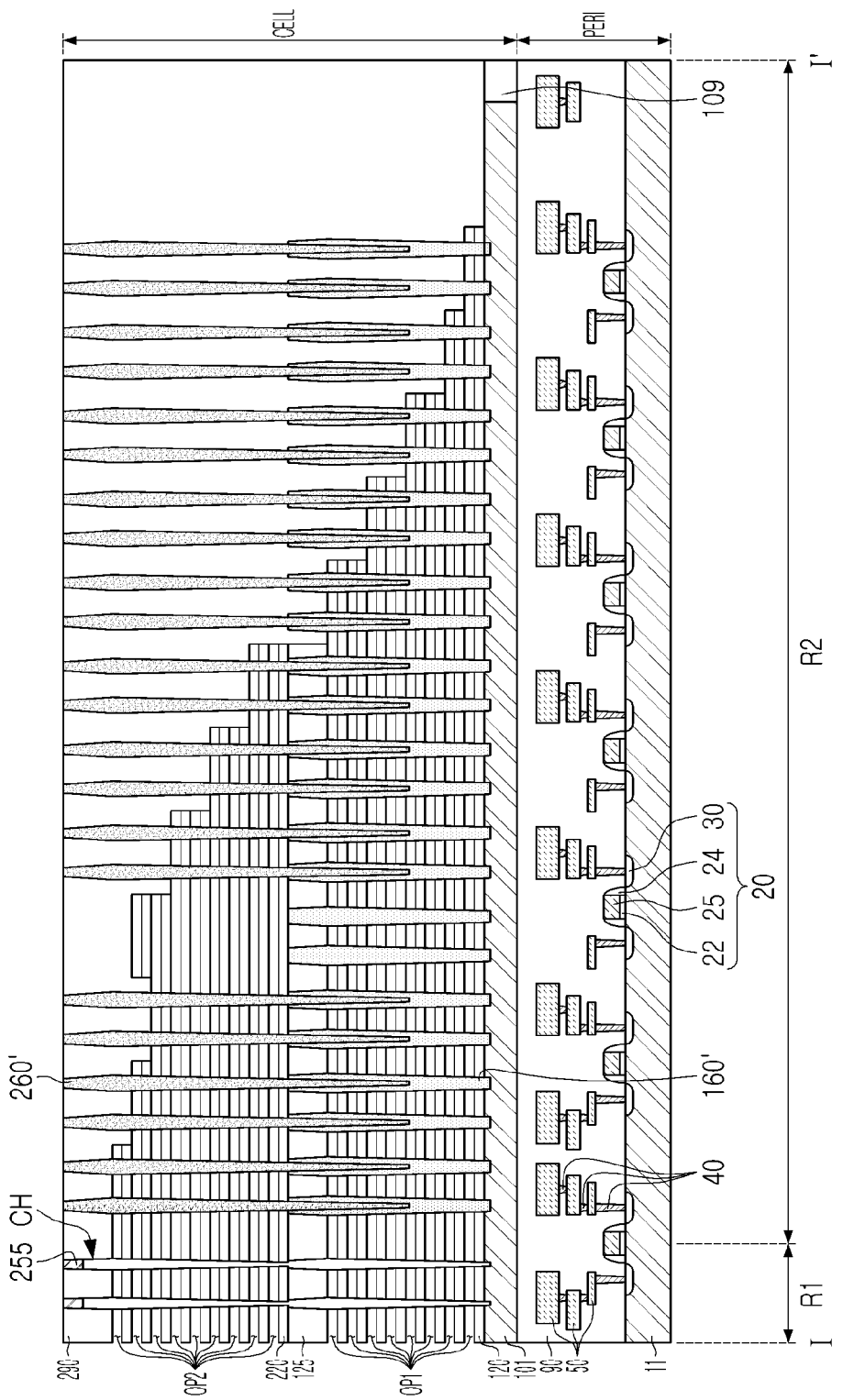

Referring to FIG. 14C, an opening penetrating the lower stack structure of the first sacrificial insulating layers 128 and the first interlayer insulating layers 120 and the upper stack structure of the second sacrificial insulating layers 228 and the second interlayer insulating layers 120 may be formed, and the first and second sacrificial insulating layers 128 and 228 may be removed through the opening. This process may be the same as the manufacturing process of the semiconductor device described with reference to FIG. 13E.

Even in the example embodiment, by additionally disposing the first support structure 160' having a relatively large width in the region having weak structural stability, stability of the stack structure may be secured.

Figure 14D:
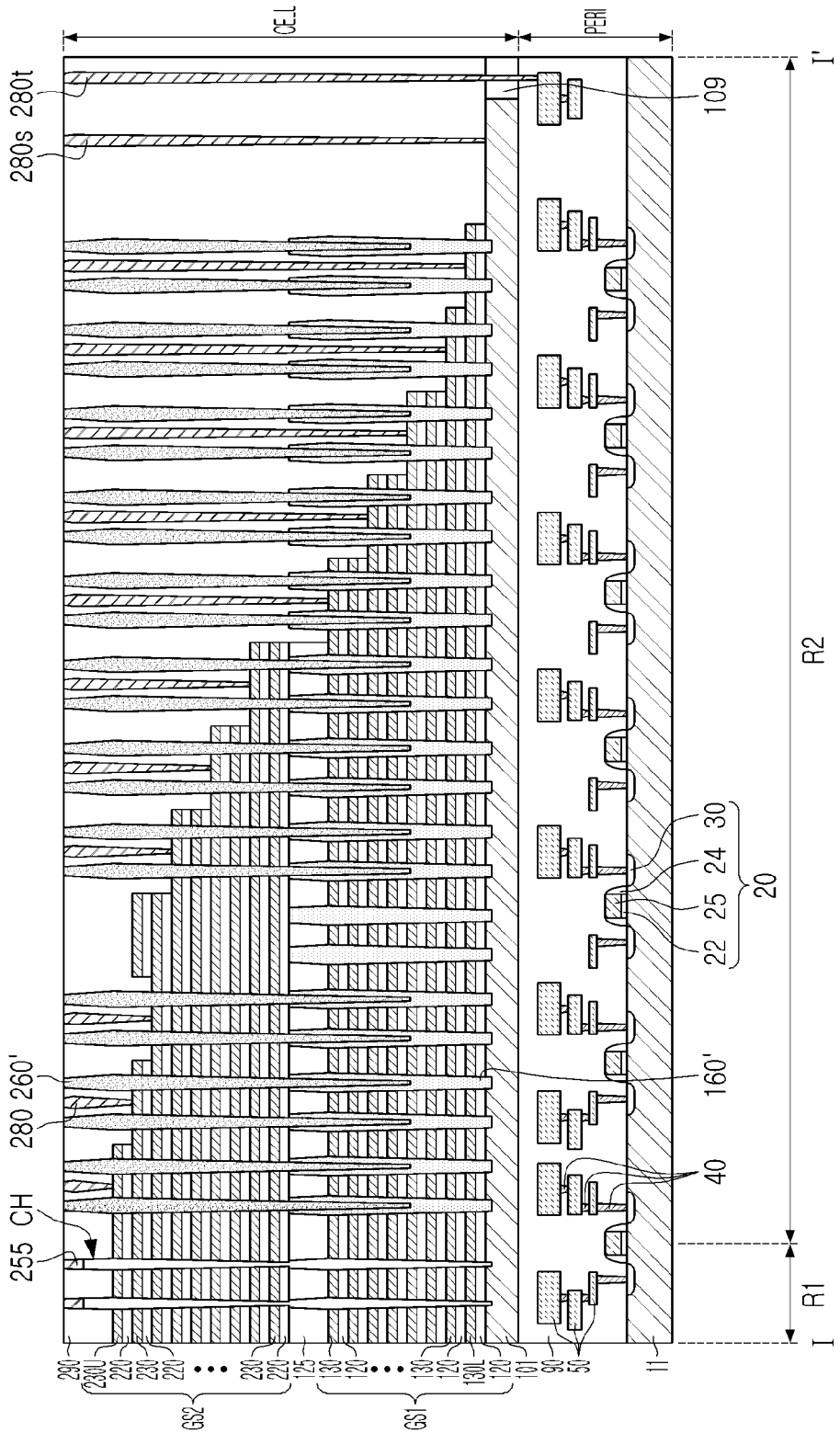

Referring to FIG. 14D, first and second gate electrodes 130 and 230 may be formed in the region from which the first and second sacrificial insulating layers 128 and 228 are removed, and contact structures 280 connected to the gate electrodes 130 and 230 may be formed. This process may be the same as the manufacturing process of the semiconductor device described with reference to FIG. 13F.

Thereafter, the semiconductor device 200 in FIG. 6 may be manufactured by forming the separation structure MS, the contact structures 280, the upper contact structure 282, and the upper wirings 284.

FIGS. 15A to 15F are cross-sectional views illustrating a method of manufacturing a semiconductor device according to example embodiments, illustrating regions corresponding to FIG. 9.

Figure 15A:
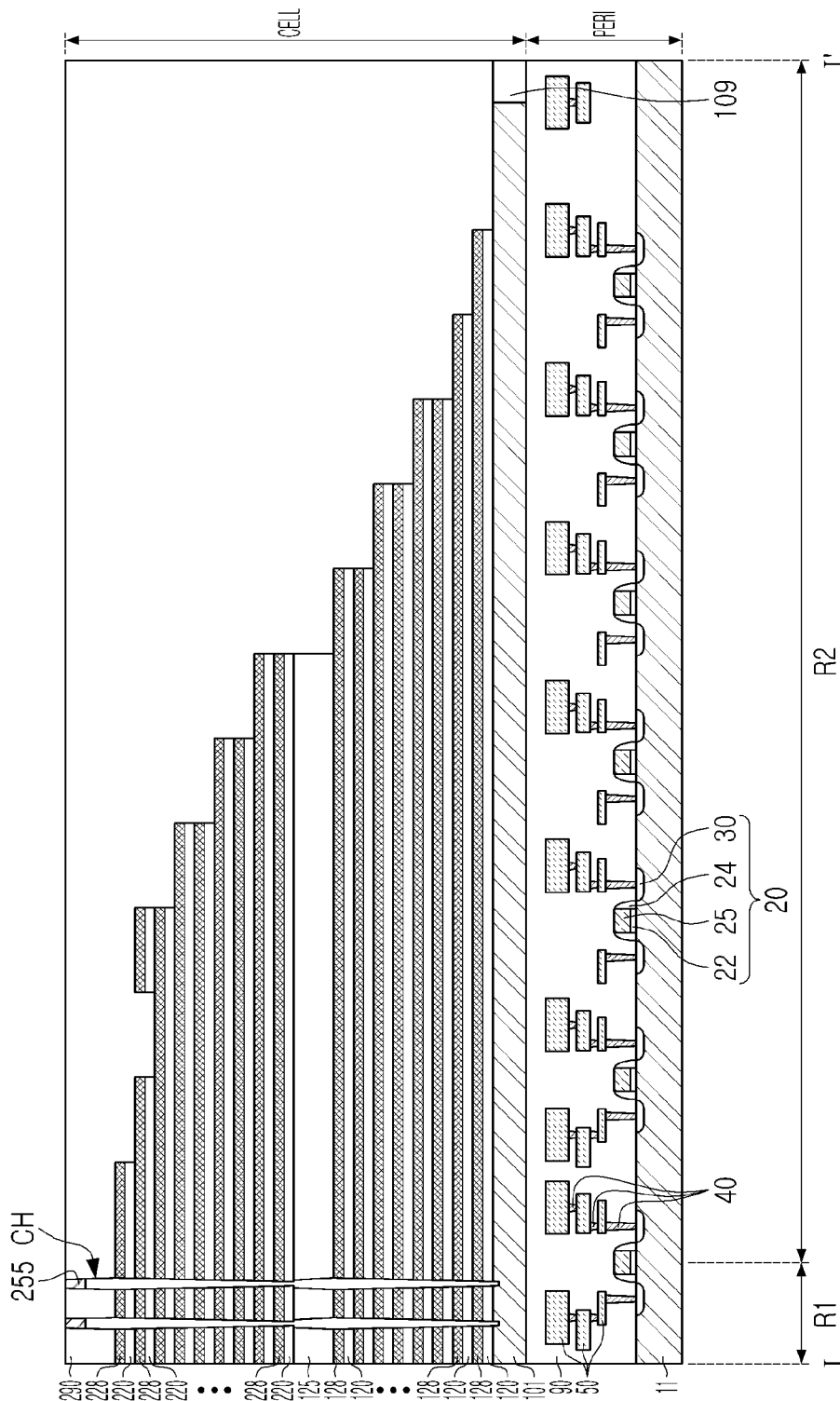
FIGS. 15A to 15F are cross-sectional views illustrating a method of manufacturing a semiconductor device according to example embodiments of the present disclosure.

Referring to FIG. 15A, similarly to the example embodiment described with reference to FIGS. 13A to 13C, a lower stack structure including first sacrificial insulating layers 128 and first interlayer insulating layers 120 and an upper stack structure including second sacrificial insulating layers 228 and second interlayer insulating layers 220 may be formed on a peripheral circuit structure PERI, and channel structures CH may be formed. Differently from the example in FIG. 13C, the process of forming the first support structure 160 may not be performed.

Figure 15B:
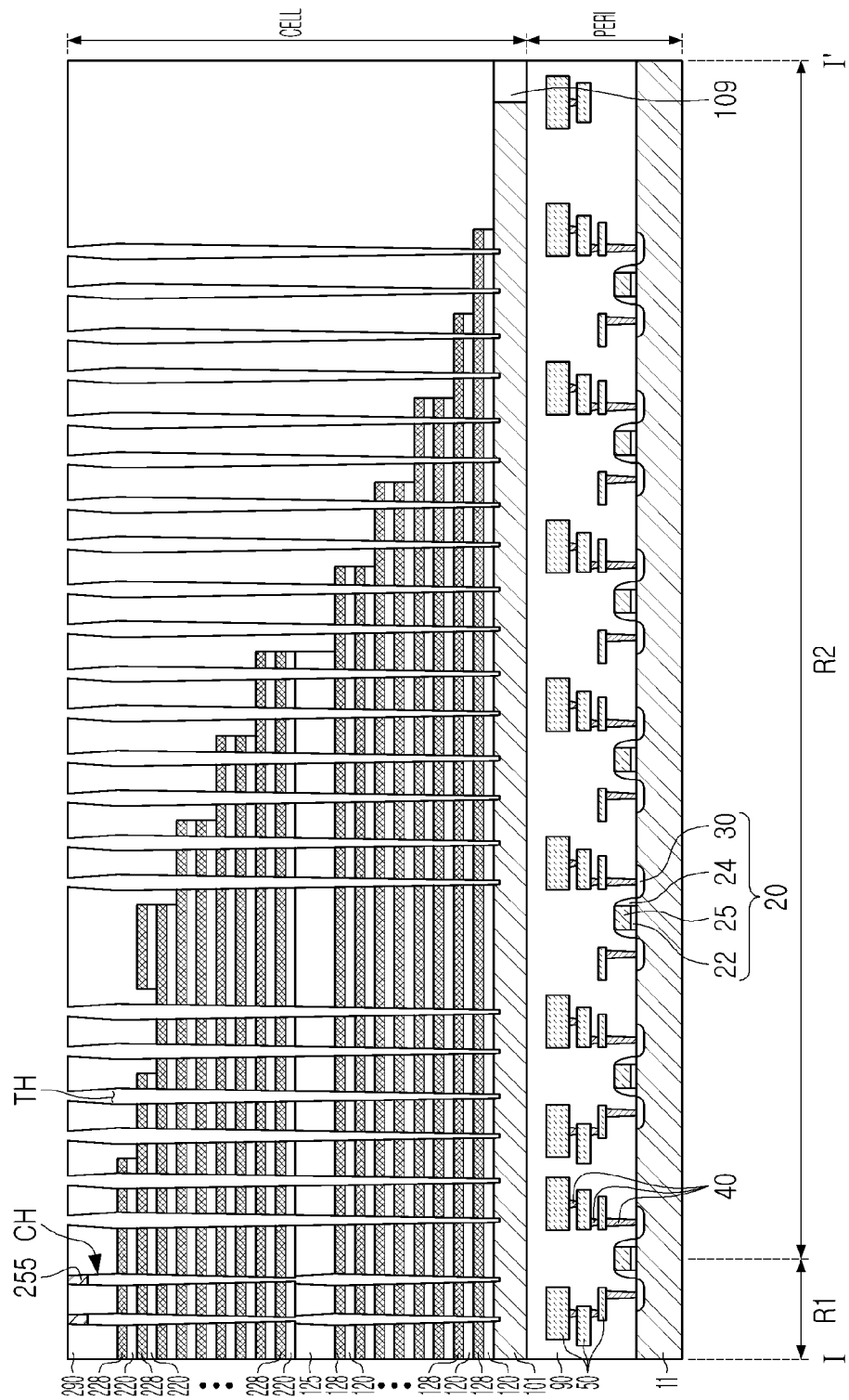

Referring to FIG. 15B, through holes TH penetrating the lower stack structure including the first sacrificial insulating layers 128 and the first interlayer insulating layers 120, the upper stack structure including the second sacrificial insulating layers 228 and the second interlayer insulating layers 220, and capping insulating layer 290 may be formed.

The lower ends of the through holes TH may be partially recessed into the second substrate 101. The through holes TH may have an inclined lateral surface of which a width may decrease downwardly due to a high aspect ratio.

Figure 15C:
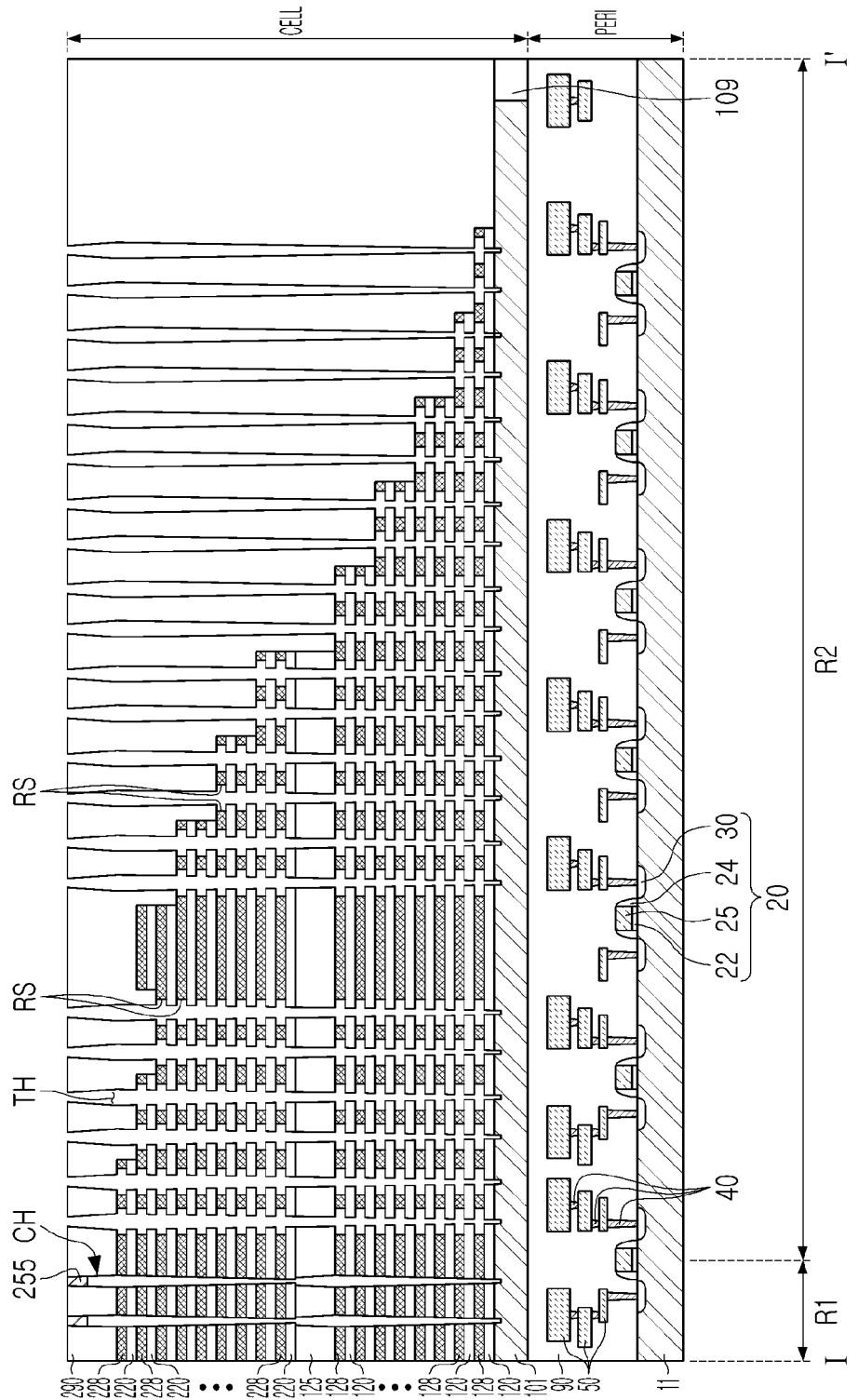

Referring to FIG. 15C, horizontal recess regions RS may be formed by partially removing the first and second sacrificial insulating layers 128 and 228 through the through holes TH.

Only a portion of the first and second sacrificial insulating layers 128 and 228 may be selectively removed with respect to the first and second interlayer insulating layers 220 using, for example, isotropic etching. Accordingly, horizontal recess regions RS extending to a region between the first interlayer insulating layers 120 and between the second interlayer insulating layers 220, adjacent to each other, may be formed.

Figure 15D:
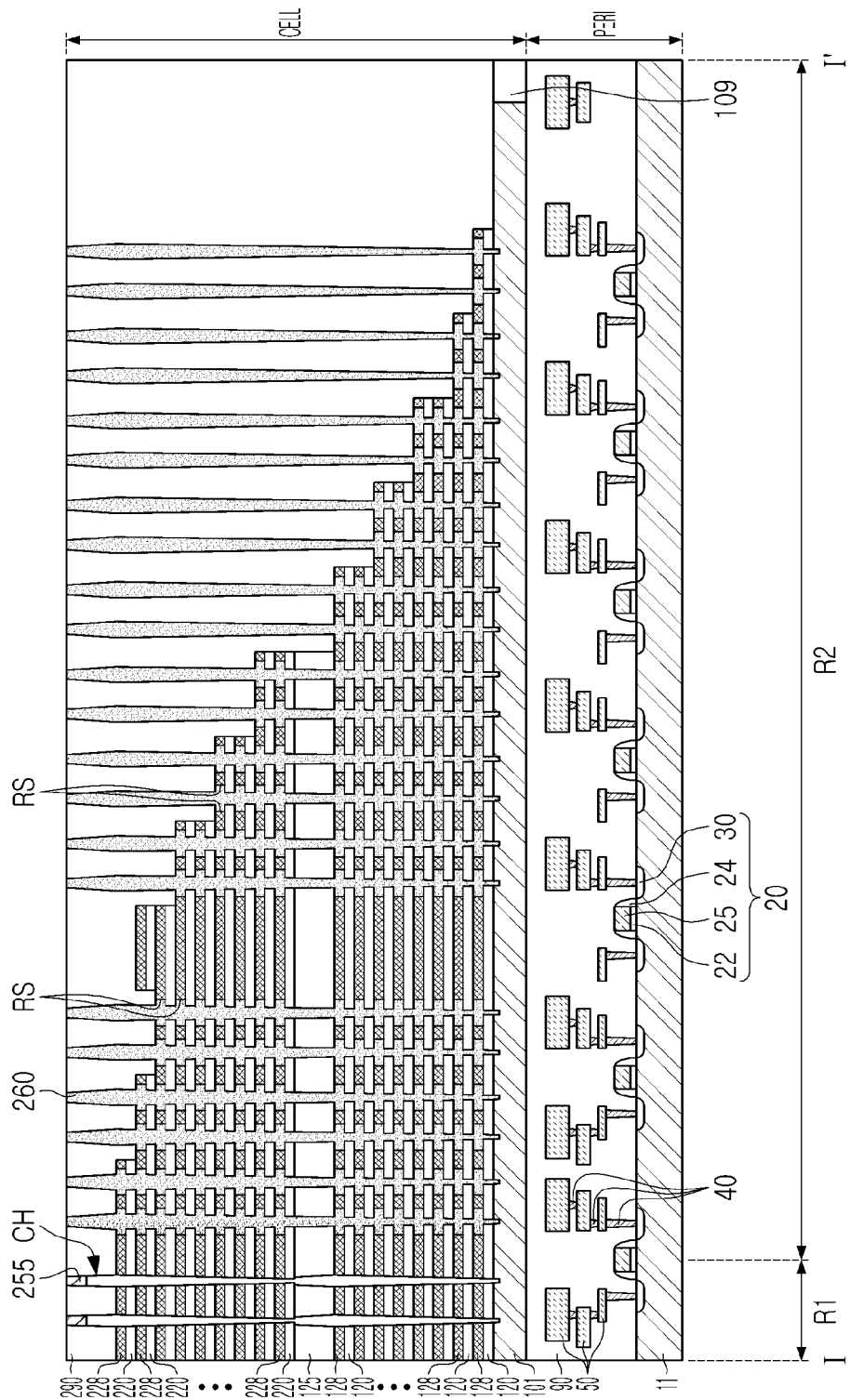

Referring to FIG. 15D, support structures SP' including a plurality of protrusions P1 and P2 may be formed by filling an insulating material in the through holes TH and the horizontal recess regions RS.

The support structure SP' may include a plurality of first protrusions P1 in contact with sidewalls of the first sacrificial insulating layers 128 and extending to a region between the first interlayer insulating layers 120 vertically adjacent to each other, and a plurality of second protrusions P2 in contact with sidewalls of the second sacrificial insulating layers 228 and extending to a region between the second interlayer insulating layers 220 vertically adjacent to each other.

Figure 15E:
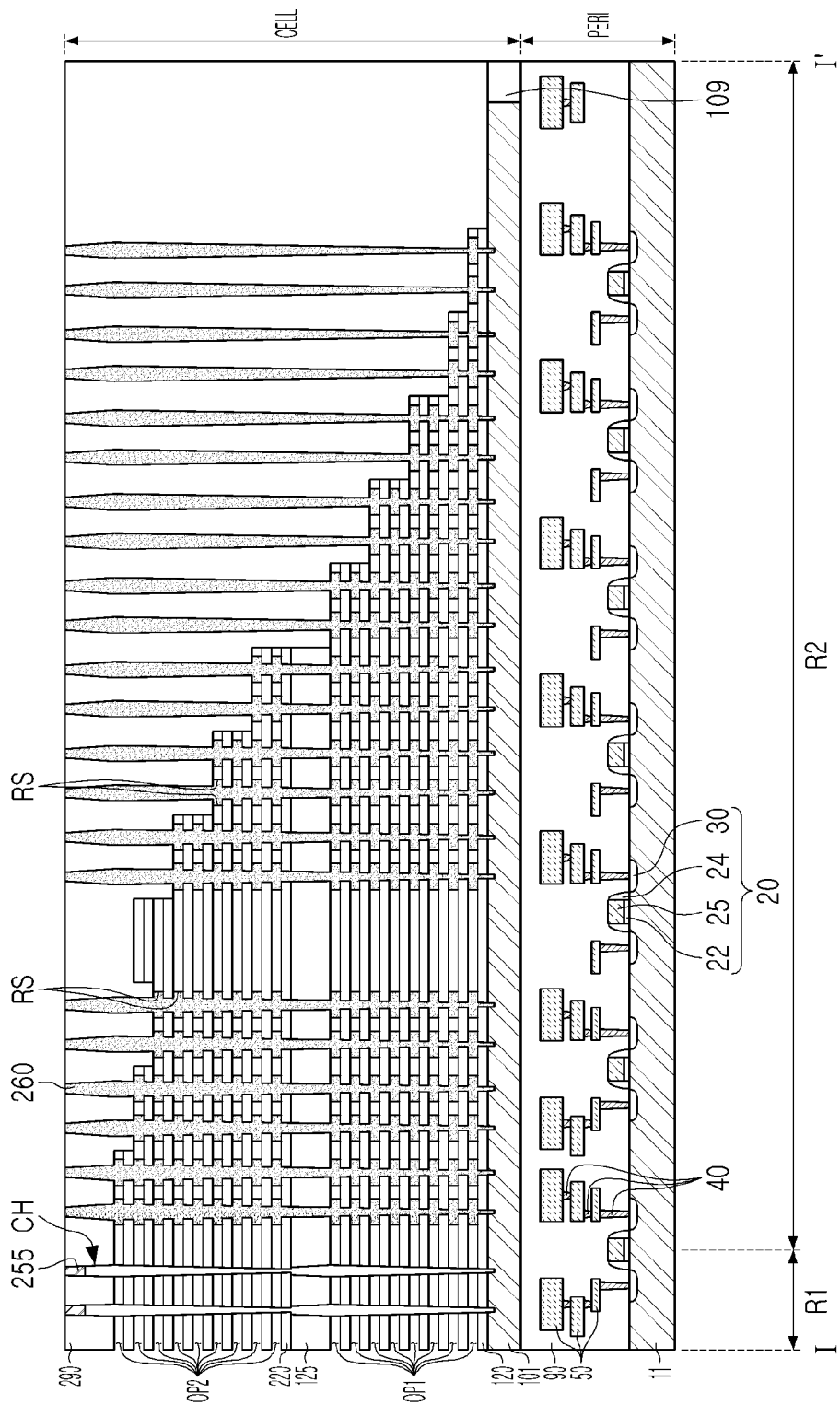

Referring to FIG. 15E, an opening penetrating the lower stack structure of the first sacrificial insulating layers 128 and the first interlayer insulating layers 120 and the upper stack structure of the second sacrificial insulating layers 228 and the second interlayer insulating layers 220 may be formed, and the first and second sacrificial insulating layers 128 and 228 may be removed through the opening. This process may be the same as the manufacturing process of the semiconductor device described with reference to FIG. 13E.

Even in the example embodiment, by disposing the support structures SP' including the plurality of protrusions P1 and P2 in a region having weak structural stability, stability of the stack structure may be secured.

Figure 15F:
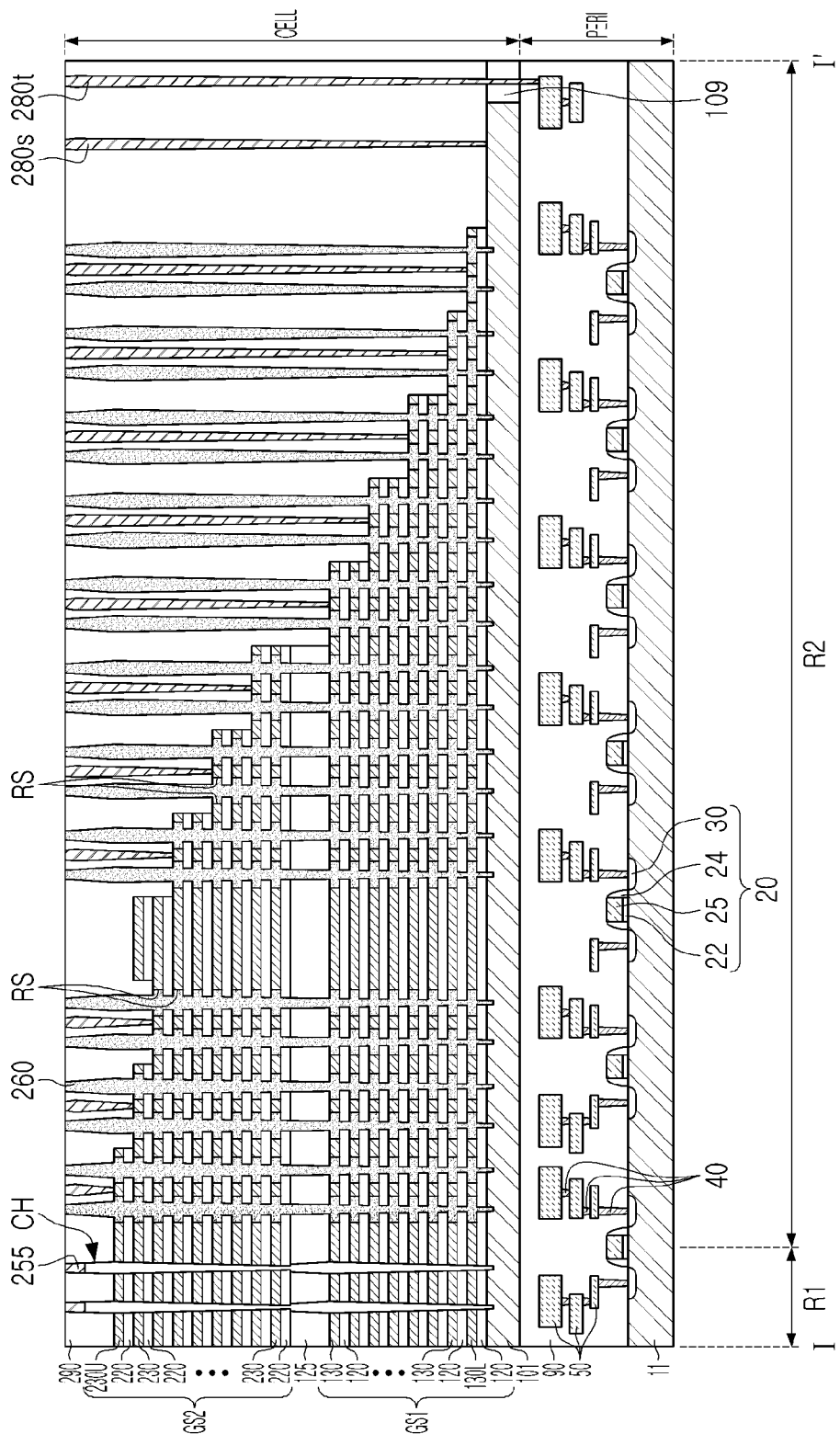

Referring to FIG. 15F, first and second gate electrodes 130 and 230 may be formed in the region from which the first and second sacrificial insulating layers 128 and 228 are removed, and contact structures 280 connected to the first and second gate electrodes 130 and 230 may be formed. This process may be the same as the manufacturing process of the semiconductor device described with reference to FIG. 13F.

Thereafter, a separation structure MS, the contact structures 280, an upper contact structure 282, and upper wirings 284 may be formed, thereby manufacturing the semiconductor device 300 in FIG. 9.

Figure 16:
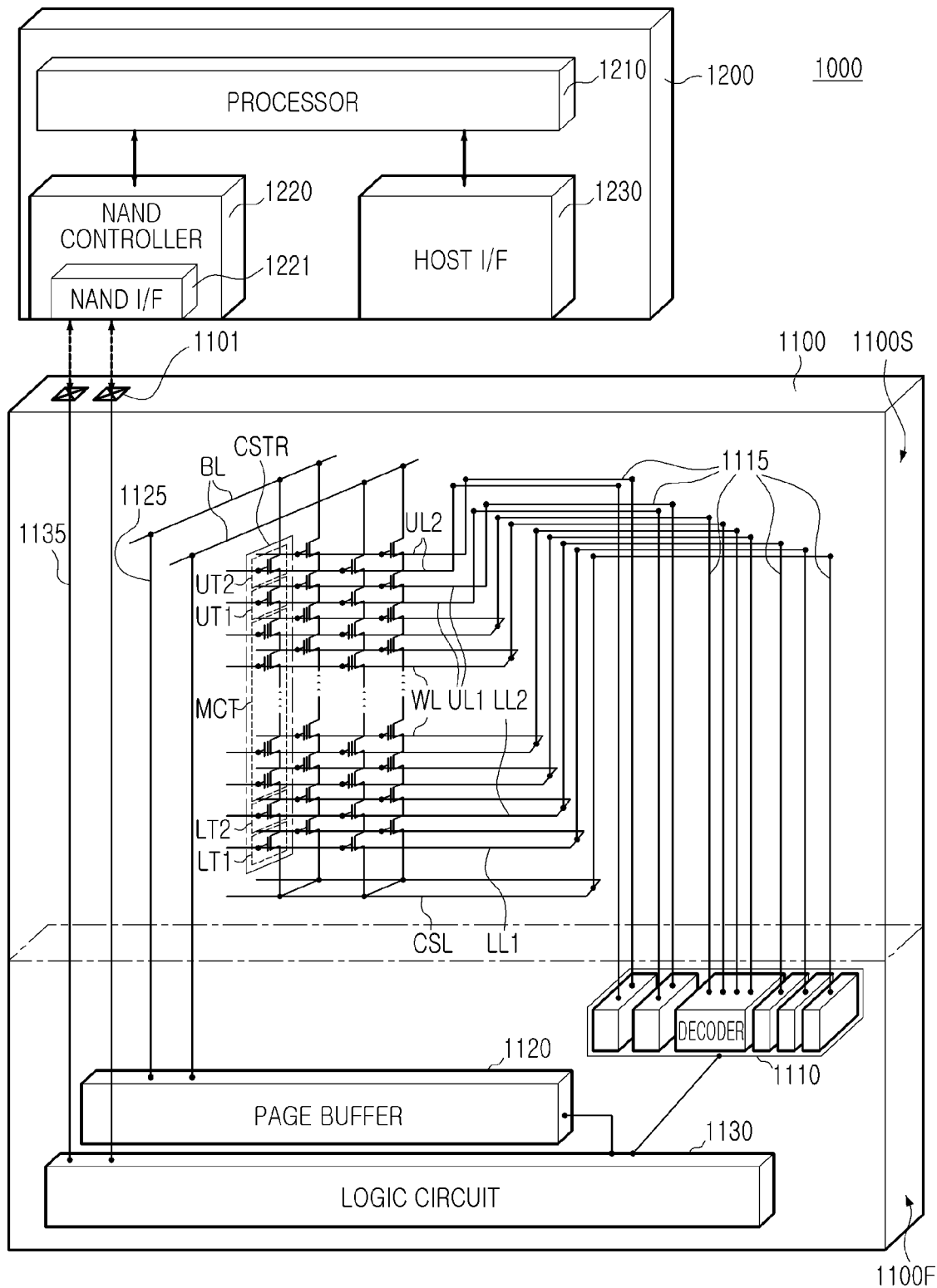
FIG. 16 is a view illustrating a data storage system including a semiconductor device according to an example embodiment of the present disclosure.

FIG. 16 is a view illustrating a data storage system including a semiconductor device according to an example embodiment.

Referring to FIG. 16, a data storage system 1000 may include a semiconductor device 1100 and a controller 1200 electrically connected to the semiconductor device 1100. The data storage system 1000 may be implemented by a storage device including one or more semiconductor devices 1100 or an electronic device including the storage device. For example, the data storage system 1000 may be implemented by a solid state drive device (SSD) including one or more semiconductor devices 1100, a universal serial bus (USB), a computing system, a medical device, or a communication device.

The semiconductor device 1100 may be implemented as a nonvolatile memory device, and may be implemented as, for example, the NAND flash memory device described in the aforementioned example embodiments with reference to FIGS. 1, 2, 3A to 3C, 4A, 4B, 5 to 7, 8A, 8B, 9, 10, 11A to 11C, and 12A to 12C. The semiconductor device 1100 may include a first structure 1100F and a second structure 1100S on the first structure 1100F. For example, the first and second structures 1100F and 1100S may correspond to the memory cell structure CELL and the peripheral circuit structure PERI described in the aforementioned example embodiments. In example embodiments, the first structure 1100F may be disposed adjacent to the second structure 1100S. The first structure 1100F may be implemented as a peripheral circuit structure including a decoder circuit 1110, a page buffer 1120, and a logic circuit 1130. The second structure 1100S may be implemented as a memory cell structure including a bit line BL, common source line CSL, word lines WL, first and second gate upper lines UL1 and UL2, first and second gate lower lines LL1 and LL2, and memory cell strings CSTR between the bit line BL and the common source line CSL.

In the second structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistors UT1 and UT2. The number of lower transistors LT1 and LT2 and the number of upper transistors UT1 and UT2 may be varied in example embodiments.

In example embodiments, the upper transistors UT1 and UT2 may include a string select transistor, and the lower transistors LT1 and LT2 may include a ground select transistor. The lower gate lines LL1 and LL2 may be configured as gate electrodes of the lower transistors LT1 and LT2, respectively. The word lines WL may be configured as gate electrodes of the memory cell transistors MCT, and the upper gate lines UL1 and UL2 may be configured as gate electrodes of the upper transistors UT1 and UT2, respectively.

In example embodiments, the lower transistors LT1 and LT2 may include a lower erase control transistor LT1 and a ground select transistor LT2 connected to each other in series. The upper transistors UT1 and UT2 may include a string select transistor UT1 and an upper erase control transistor UT2 connected to each other in series. At least one of the lower erase control transistor LT1 and the upper erase control transistor UT2 may be used for an erase operation of erasing data stored in the memory cell transistors MCT using a GIDL phenomenon.

The common source line CSL, the first and second gate lower lines LL1 and LL2, the word lines WL, and the first and second gate upper lines UL1 and UL2 may be electrically connected to the decoder circuit 1110 through first connection lines 1115 extending from the first structure 1100F to the second structure 1100S. The bit lines BL may be electrically connected to the page buffer 1120 through second connection lines 1125 extending from the first structure 1100F to the second structure 1100S.

In the first structure 1100F, the decoder circuit 1110 and the page buffer 1120 may perform a control operation on at least one selected memory cell transistor among the plurality of memory cell transistors MCT. The decoder circuit 1110 and the page buffer 1120 may be controlled by the logic circuit 1130. The semiconductor device 1000 may communicate with the controller 1200 through an input and output pad 1101 electrically connected to the logic circuit 1130. The input and output pad 1101 may be electrically connected to the logic circuit 1130 through an input and output connection wiring 1135 extending from the first structure 1100F to the second structure 1100S.

The controller 1200 may include a processor 1210, a NAND controller 1220, and a host interface 1230. In example embodiments, the data storage system 1000 may include a plurality of semiconductor devices 1100, and in this case, the controller 1200 may control the plurality of semiconductor devices 1100.

The processor 1210 may control overall operations of the data storage system 1000 including the controller 1200. The processor 1210 may operate according to a predetermined firmware, and may access the semiconductor device 1100 by controlling the NAND controller 1220. The NAND controller 1220 may include a NAND interface 1221 for processing communication with the semiconductor device 1100. Through the NAND interface 1221, a control command for controlling the semiconductor device 1100, data to be written in the memory cell transistors MCT of the semiconductor device 1100, and data to be read from the memory cell transistors MCT may be transmitted. The host interface 1230 may provide a communication function between the data storage system 1000 and an external host. When a control command is received from an external host through the host interface 1230, the processor 1210 may control the semiconductor device 1100 in response to the control command.

Figure 17:
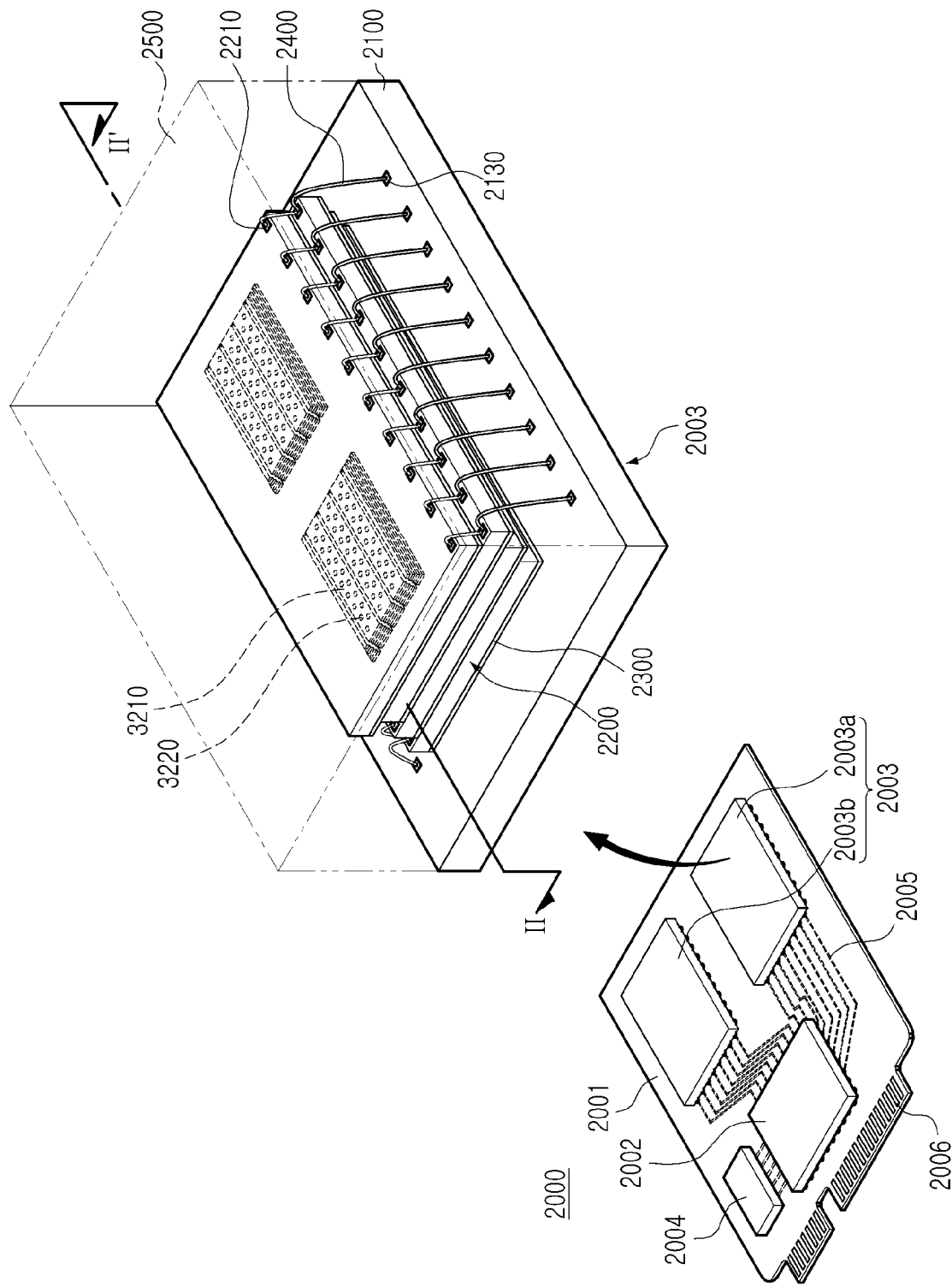
FIG. 17 is a perspective view illustrating a data storage system including a semiconductor device according to an example embodiment of the present disclosure.

FIG. 17 is a perspective view illustrating a data storage system including a semiconductor device according to an example embodiment.

Referring to FIG. 17, a data storage system 2000 in an example embodiment may include a main substrate 2001, a controller 2002 mounted on the main substrate 2001, one or more semiconductor packages 2003, and a DRAM 2004. The semiconductor package 2003 and the DRAM 2004 may be connected to the controller 2002 by wiring patterns 2005 formed on the main substrate 2001.

The main substrate 2001 may include a connector 2006 including a plurality of pins coupled to an external host. The number and the arrangement of the plurality of pins in the connector 2006 may be varied depending on a communication interface between the data storage system 2000 and an external host. In example embodiments, the data storage system 2000 may communicate with an external host according to one of interfaces such as universal serial bus (USB), peripheral component interconnect express (PCI-Express), serial advanced technology attachment (SATA), M-Phy for universal flash storage (UFS), and the like. In example embodiments, the data storage system 2000 may be operated by power supplied from an external host through the connector 2006. The data storage system 2000 may further include a power management integrated circuit (PMIC) for distributing power supplied from the external host to the controller 2002 and the semiconductor package 2003.

The controller 2002 may write data in the semiconductor package 2003 or may read data from the semiconductor package 2003, and may improve an operation speed of the data storage system 2000.

The DRAM 2004 may be implemented as a buffer memory for mitigating a difference in speeds between the semiconductor package 2003, a data storage space, and an external host. The DRAM 2004 included in the data storage system 2000 may also operate as a cache memory, and may provide a space for temporarily storing data in a control operation for the semiconductor package 2003. When the DRAM 2004 is included in the data storage system 2000, the controller 2002 may further include a DRAM controller for controlling the DRAM 2004 in addition to the NAND controller for controlling the semiconductor package 2003.

The semiconductor package 2003 may include first and second semiconductor packages 2003a and 2003b spaced apart from each other. Each of the first and second semiconductor packages 2003a and 2003b may be configured as a semiconductor package including a plurality of semiconductor chips 2200. Each of the first and second semiconductor packages 2003a and 2003b may include a package substrate 2100, semiconductor chips 2200 on the package substrate 2100, and adhesive layers 2300 disposed on a lower surface of each of the semiconductor chips 2200, a connection structure 2400 electrically connecting the semiconductor chips 2200 to the package substrate 2100, and a molding layer 2500 covering the semiconductor chips 2200 and the connection structure 2400 on the package substrate 2100.

The package substrate 2100 may be configured as a printed circuit board including the package upper pads 2130. Each semiconductor chip 2200 may include an input and output pad 2210. The input and output pad 2210 may correspond to the input and output pad 1101 in FIG. 16. Each of the semiconductor chips 2200 may include gate stack structures 3210 and channel structures 3220. Each of the semiconductor chips 2200 may include the semiconductor device described in the aforementioned example embodiment with reference to FIGS. 1, 2, 3A to 3C, 4A, 4B, 5 to 7, 8A, 8B, 9, 10, 11A to 11C, and 12A to 12C.

In example embodiments, the connection structure 2400 may be configured as a bonding wire electrically connecting the input and output pad 2210 to the package upper pads 2130. Accordingly, in each of the first and second semiconductor packages 2003a and 2003b, the semiconductor chips 2200 may be electrically connected to each other by a bonding wire method, and may be electrically connected to the package upper pads 2130 of the package substrate 2100. In example embodiments, in each of the first and second semiconductor packages 2003a and 2003b, the semiconductor chips 2200 may be electrically connected to each other by a connection structure including a through substrate via (e.g., through silicon via (TSV)), instead of the connection structure 2400 of a bonding wire type.

In example embodiments, the controller 2002 and the semiconductor chips 2200 may be included in a single package. In an example embodiment, the controller 2002 and the semiconductor chips 2200 may be mounted on an interposer substrate separate from the main substrate 2001, and the controller 2002 may be connected to the semiconductor chips 2200 by wiring formed on the interposer substrate.

Figure 18:
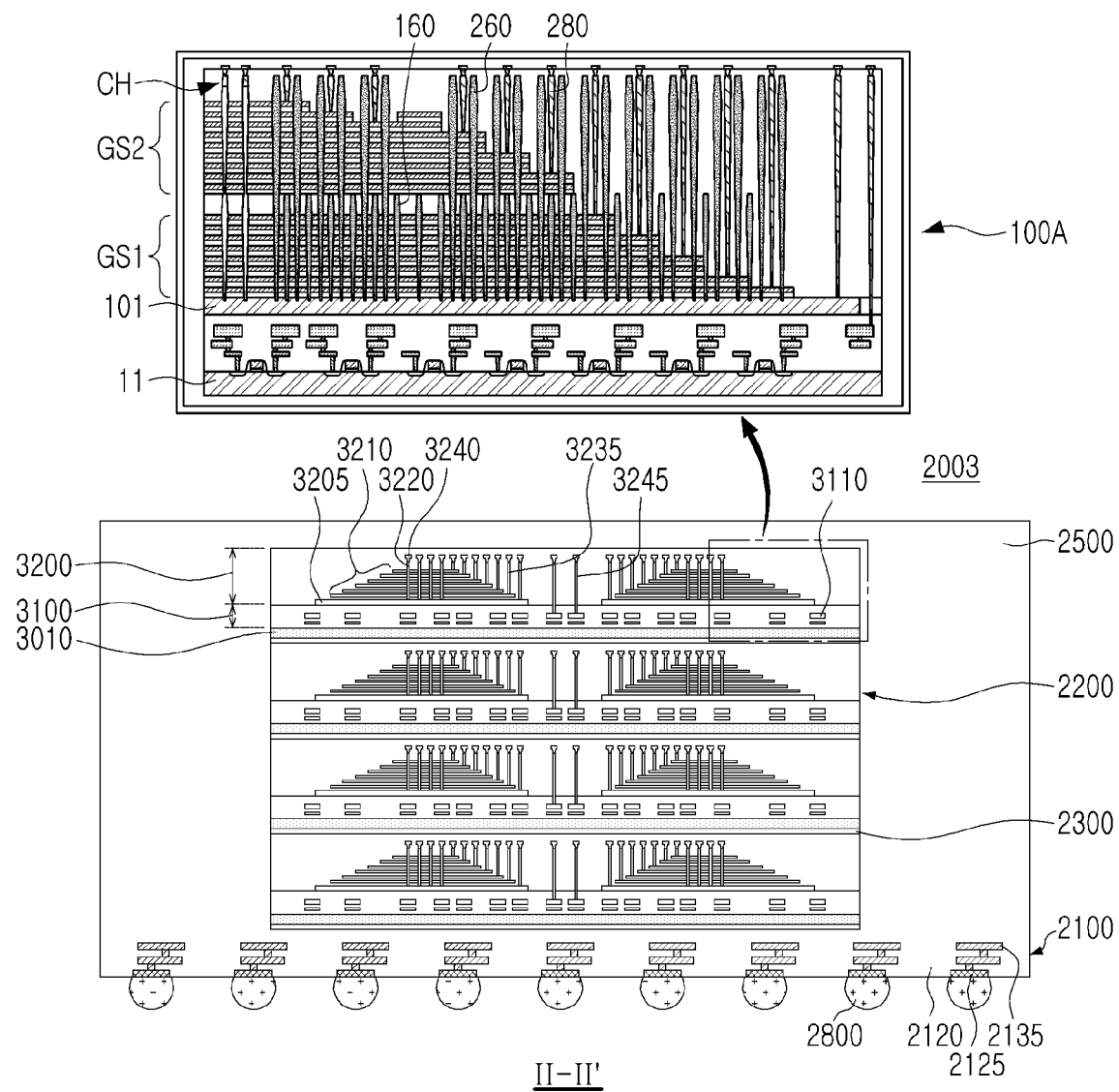
FIGS. 18 and 19 are cross-sectional views illustrating a semiconductor package according to example embodiments of the present disclosure.
Figure 19:
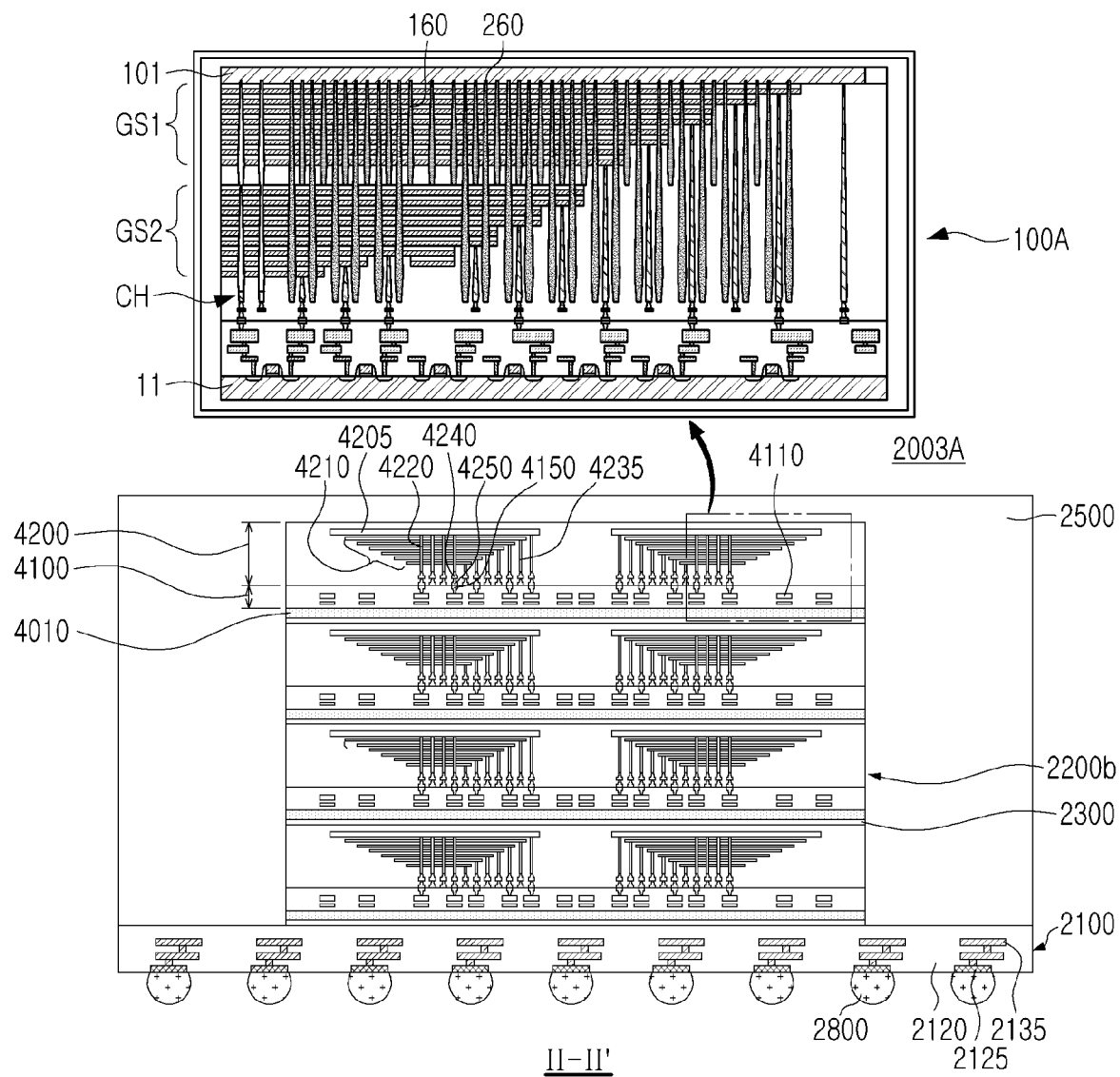

FIGS. 18 and 19 are cross-sectional views illustrating a semiconductor package taken along line II-II' in FIG. 17 according to example embodiments, each illustrating an example embodiment of the semiconductor package 2003 in FIG. 17.

Referring to FIG. 18, in a semiconductor package 2003, a package substrate 2100 may be configured as a printed circuit board. The package substrate 2100 may include a package substrate body portion 2120, package upper pads 2130 (see FIG. 17) disposed on the upper surface of the package substrate body portion 2120, lower pads 2125 disposed on or exposed through the lower surface of the package substrate body portion 2120, and internal wirings 2135 electrically connecting the package upper pads 2130 to the lower pads 2125 in the package substrate body portion 2120. The upper pads 2130 may be electrically connected to the connection structures 2400. The lower pads 2125 may be connected to the wiring patterns 2005 of the main substrate 2001 of the data storage system 2000 as illustrated in FIG. 17 through conductive connection portions 2800.

Each of the semiconductor chips 2200 may include a semiconductor substrate 3010, and a first structure 3100 and a second structure 3200 stacked in order on the semiconductor substrate 3010. For example, the first and second structures 3100 and 3200 may correspond to the memory cell structure CELL and the peripheral circuit structure PERI described in the aforementioned example embodiments. The first structure 3100 may include a peripheral circuit region including peripheral wirings 3110. The second structure 3200 may include a common source line 3205, a gate stack structure 3210 on the common source line 3205, channel structures 3220 penetrating the gate stack structure 3210, bit lines 3240 electrically connected to the channel structures 3220, and gate contact plugs or gate connection wirings 3235 electrically connected to the word lines WL (see FIG. 16) of the gate stack structure 3210. As described in the aforementioned example embodiment with reference to FIGS. 1, 2, and 3A to 3C, each of the semiconductor chips 2200 may include a first support structure 160 penetrating the first stack structure GS1, and a second support structure 260 having a height greater than that of the first support structure 160 with the first support structure 160 interposed therebetween as illustrated in the enlarged view. In another example, as described in the example embodiment with reference to FIG. 6, each of the semiconductor chips 2200 may include the first support structure 160 and the second support structure 260 disposed in positions overlapping each other, and as described in the example embodiment with reference to FIG. 9, each of the semiconductor chips 2200 may include a support structure SP including protrusions P1 and P2. For example, the semiconductor device 100A of each of the semiconductor chips 2200 may include the semiconductor device described in the aforementioned example embodiments with reference to FIGS. 1, 2, 3A to 3C, 4A, 4B, 5 to 7, 8A, 8B, 9, 10, 11A to 11C.

Each of the semiconductor chips 2200 may include a through wiring 3245 electrically connected to the peripheral wirings 3110 of the first structure 3100 and extending into the second structure 3200. The through wiring 3245 may be disposed on an external side of the gate stack structure 3210, and may be further disposed to penetrate the gate stack structure 3210. Each of the semiconductor chips 2200 may further include an input and output pad 2210 (see FIG. 16) electrically connected to the peripheral wirings 3110 of the first structure 3100.

Referring to FIG. 19, in a semiconductor package 2003A, each of semiconductor chips 2200a may include a semiconductor substrate 4010, a first structure 4100 on the semiconductor substrate 4010, and a second structure 4200 bonded to the first structure 4100 by a wafer bonding method.

The first structure 4100 may include a peripheral circuit region including the peripheral wiring 4110 and the first bonding structures 4150. The second structure 4200 may include a common source line 4205, a gate stack structure 4210 between the common source line 4205 and the first structure 4100, memory channel structures 4220 penetrating the gate stack structure 4210, and second bonding structures 4250 electrically connected to word lines WL (see FIG. 16) of the memory channel structures 4220 and the gate stack structure 4210, respectively. For example, the second bonding structures 4250 may be electrically connected to the memory channel structures 4220 and the word lines WL (see FIG. 16), respectively, through the bit lines 4240 electrically connected to the memory channel structures 4220 and gate contact plugs or gate connection wirings 4235 electrically connected to the word lines WL (see FIG. 16). The first bonding structures 4150 of the first structure 4100 and the second bonding structures 4250 of the second structure 4200 may be in contact with each other and may be bonded to each other. Bonded portions of the first bonding structures 4150 and the second bonding structures 4250 may be formed of, for example, copper (Cu).

As illustrated in the enlarged view, the semiconductor device 400 of each of the semiconductor chips 2200*a* may further include a first support structure 160 and a second support structure 260. In another example, each of the semiconductor chips 2200*a* may include the semiconductor device in FIGS. 12B and 12C. In another example, each of the semiconductor chips 2200*a* may include a semiconductor device in which the example embodiments in FIGS. 1, 2, 3A to 3C, 4A, 4B, 5 to 7, 8A, 8B, 9, 10, 11A to 11C are applied to the example embodiments in FIGS. 12A to 12C. Each of the semiconductor chips 2200*a* may further include an input and output pad 2210 (in FIG. 16) electrically connected to the peripheral wirings 4110 of the first structure 4100.

The semiconductor chips 2200 in FIG. 18 and the semiconductor chips 2200*a* in FIG. 19 may be electrically connected to each other by connection structures 2400 in FIG. 16 configured in the form of bonding wires. However, in example embodiments, semiconductor chips in a single semiconductor package, such as the semiconductor chips 2200 in FIG. 18 and the semiconductor chips 2200*a* in FIG. 19, may be electrically connected to each other through a connection structure including a through substrate via (e.g., through silicon via (TSV)).

According to the aforementioned example embodiments, by improving structural stability of the stack structure including a support structure to support the stack structure, a semiconductor device having improved reliability and a data storage system including the same may be provided.

While the example embodiments have been illustrated and described above, it will be apparent to those skilled in the art that modifications and variations could be made without departing from the scope of the present disclosure as defined by the appended claims.

What is claimed is:

1. A semiconductor device, comprising:
first gate electrodes stacked and spaced apart from each other in a first direction on a first region of a substrate, and extending in staircase form in a second direction perpendicular to the first direction on a second region of the substrate;
second gate electrodes disposed on the first gate electrodes, stacked and spaced apart from each other in the first direction on the first region, and extending in staircase form in the second direction on the second region;
a channel structure penetrating the first and second gate electrodes, extending in the first direction, and including a channel layer;
first support structures penetrating the first gate electrodes on the second region, extending in the first direction, and each having an upper end disposed at a level lower than a level of a lowermost second gate electrode among the second gate electrodes;
second support structures penetrating at least one of the first and second gate electrodes on the second region, extending in the first direction, and each having an upper end disposed at a level higher than a level of an uppermost second gate electrode among the second gate electrodes; and
contact structures contacting upper surfaces of the first and second gate electrodes having staircase form, respectively,
wherein the first support structures are spaced apart from the second support structures and between the second support structures.

2. The semiconductor device of claim 1, wherein a first vertical length between a lower end of each of the first support structures and the upper end of each of the first support structures is less than a second vertical length between a lower end of each of the second support structures and the upper end of each of the second support structures.

3. The semiconductor device of claim 1, wherein each of the first support structures and each of the second support structures include an inclined lateral surface.

4. The semiconductor device of claim 1, wherein each of the first support structures and each of the second support structures are formed of an insulating material.

5. The semiconductor device of claim 1,
wherein the substrate includes a silicon layer, and
wherein a lower end of each of the first support structures is in contact with the silicon layer.

6. The semiconductor device of claim 5, wherein a lower end of each of the second support structures is in contact with the silicon layer.

7. The semiconductor device of claim 1,
wherein the upper end of each of the first support structures has a first width, and
wherein each of the second support structures has a second width smaller than the first width at the same level as the upper end of each of the first support structures.

8. The semiconductor device of claim 1,
wherein each of the first support structures and each of the second support structures include a plurality of third support structures and a plurality of fourth support structures, respectively, and disposed on the second region, and
wherein at least one of the contact structures overlaps at least one of the first support structures in the first direction.

9. The semiconductor device of claim 8, wherein at least one of the contact structures does not overlap the first support structures in the first direction.

10. The semiconductor device of claim 1, further comprising:
a peripheral circuit structure including a base substrate disposed above or below the substrate, circuit devices on the base substrate, and circuit wiring lines electrically connected to the circuit devices.

11. The semiconductor device of claim 10, further comprising:
a through contact structure penetrating the first and second gate electrodes and the substrate, extending in the first direction, and electrically connected to the circuit devices through the circuit wiring lines.

12. The semiconductor device of claim 10, further comprising:
first bonding pads electrically connected to an upper end of the channel structure and upper ends of the contact structures, respectively; and
second bonding pads electrically connected to the circuit wiring lines and bonded to the first bonding pads.

13. A semiconductor device, comprising:

a substrate;

first gate electrodes disposed on the substrate, stacked and spaced apart from each other in a vertical direction, and extending in staircase form in a horizontal direction;

second gate electrodes disposed on the first gate electrodes, stacked and spaced apart from each other in the vertical direction, and extending in staircase form in the horizontal direction;

a channel structure penetrating the first and second gate electrodes, extending in the vertical direction, and including a channel layer;

first support structures penetrating at least one of gate electrodes of the first and second gate electrodes, extending in the vertical direction, and each having a lower end in contact with the substrate; and contact structures connected to upper surfaces of the first and second gate electrodes having staircase form, respectively, wherein among the first support structures, each of the first support structures penetrating the first gate electrodes includes a plurality of first protrusions protruding toward lateral surfaces of the first gate electrodes.

14. The semiconductor device of claim 13, further comprising:

first interlayer insulating layers disposed between the first gate electrodes and stacked and spaced apart from each other in the vertical direction, wherein the plurality of first protrusions extend in the horizontal direction between the first interlayer insulating layers vertically adjacent to each other.

15. The semiconductor device of claim 14, wherein among the first support structures, each of the first support structures penetrating the second gate electrodes further includes a plurality of second protrusions protruding toward lateral surfaces of the second gate electrodes, wherein the semiconductor device further includes second interlayer insulating layers disposed between the second gate electrodes and stacked and spaced apart from each other in the vertical direction, and wherein the plurality of second protrusions extend in the horizontal direction between the second interlayer insulating layers vertically adjacent to each other.

16. The semiconductor device of claim 14, further comprising:

second support structures disposed between the first protrusions of the first support structures and extending in the vertical direction.

17. A data storage system, comprising:

a semiconductor storage device including:

a peripheral circuit structure including a first substrate and circuit devices provided on the first substrate;

a second substrate disposed on the peripheral circuit structure;

a memory cell structure disposed on the second substrate; and an input and output pad electrically connected to the circuit devices, wherein the memory cell structure includes:

first gate electrodes disposed on the second substrate, stacked and spaced apart from each other in a first direction, and extending in staircase form in a second direction perpendicular to the first direction;

second gate electrodes disposed on the first gate electrodes, stacked and spaced apart from each other in the first direction, and extending in staircase form in the second direction;

channel structures penetrating the first and second gate electrodes, extending in the first direction, and including channel layers, respectively;

first support structures penetrating the first gate electrodes and each having a first height in the first direction;

second support structures penetrating at least one of the first and second gate electrodes and each having a second height greater than the first height in the first direction; and contact structures contacting upper surfaces of the first and second gate electrodes having staircase form, respectively, wherein each of the second support structures includes a portion in contact with a corresponding one of the first support structures, and wherein a lower end of each of the second support structures is disposed at a level higher than a level of a lower end of the corresponding one of the first support structures and lower than a level of an upper end of the corresponding one of the first support structures; and a controller electrically connected to the semiconductor storage device through the input and output pad and controlling the semiconductor storage device.

18. The data storage system of claim 17, wherein at least a portion of each of the second support structures overlaps at least a portion of each of the first support structures in the first direction.

19. The data storage system of claim 18, wherein an upper end of each of the first support structures has a first width, and wherein each of the second support structures has a second width smaller than the first width in a region penetrating the upper end of each of the first support structures.

* * * * *